US012344527B2

(12) United States Patent
Russo et al.

(10) Patent No.: US 12,344,527 B2
(45) Date of Patent: Jul. 1, 2025

(54) GRAPHENE FUNCTIONALIZATION METHOD, APPARATUS, AND FUNCTIONALIZED GRAPHENE PRODUCT

(71) Applicant: United Kingdom Research and Innovation, Swindon (GB)

(72) Inventors: Christopher Russo, Swindon (GB); Mathew Peet, Swindon (GB); Katerina Naydenova, Swindon (GB); Steve Scotcher, Swindon (GB); Chris Palmer, Swindon (GB); David Cattermole, Swindon (GB)

(73) Assignee: MEDICAL RESEARCH COUNCIL AS PART OF UNITED KINGDOM RESEARCH AND INNOVATION, Swindon (GB)

( * ) Notice: Subject to any disclaimer, the term of this patent is extended or adjusted under 35 U.S.C. 154(b) by 790 days.

(21) Appl. No.: 17/593,837

(22) PCT Filed: Mar. 26, 2020

(86) PCT No.: PCT/EP2020/058598
§ 371 (c)(1),
(2) Date: Sep. 24, 2021

(87) PCT Pub. No.: WO2020/193719
PCT Pub. Date: Oct. 1, 2020

(65) Prior Publication Data
US 2022/0185674 A1   Jun. 16, 2022

(30) Foreign Application Priority Data
Mar. 26, 2019   (GB) ..................... 1904187

(51) Int. Cl.
*C01B 32/194* (2017.01)
*C01B 32/198* (2017.01)
(Continued)

(52) U.S. Cl.
CPC .......... *C01B 32/194* (2017.08); *C01B 32/198* (2017.08); *C23C 16/26* (2013.01);
(Continued)

(58) Field of Classification Search
CPC ..... C01B 32/194; C01B 32/198; C23C 16/26; C23C 16/56; H01J 37/20; H01J 37/3244;
(Continued)

(56) References Cited

U.S. PATENT DOCUMENTS 5,540,959 A * 7/1996 Wang .................. C23C 16/4486
427/591
2007/0131873 A1   6/2007 Allred et al.
(Continued)

FOREIGN PATENT DOCUMENTS

CN   105000552 A   10/2015
CN   105531792 A   4/2016
(Continued)

OTHER PUBLICATIONS

Table of Contents, Science 2014; 343: 3-4 (Jan. 3, 2014) (Year: 2014).*
(Continued)

*Primary Examiner* — Daniel C. McCracken
(74) *Attorney, Agent, or Firm* — HAMILTON, BROOK, SMITH & REYNOLDS, P.C.

(57) ABSTRACT

Provided are a method of functionalizing graphene on a substrate, the method comprising the step of: exposing a substrate having a layer of graphene thereon to a plasma comprising helium and at least one functionalizing compound; as well as an apparatus for conducting the method and products formed by it.

9 Claims, 25 Drawing Sheets

(51) Int. Cl.
| | |
|---|---|
| C23C 16/26 | (2006.01) |
| C23C 16/56 | (2006.01) |
| H01J 37/20 | (2006.01) |
| H01J 37/26 | (2006.01) |
| H01J 37/32 | (2006.01) |

(52) U.S. Cl.
CPC .............. *C23C 16/56* (2013.01); *H01J 37/20* (2013.01); *H01J 37/3244* (2013.01); *H01J 37/32917* (2013.01); *C01P 2004/04* (2013.01); *H01J 37/26* (2013.01); *H01J 37/321* (2013.01); *H01J 2237/3321* (2013.01)

(58) Field of Classification Search
CPC .... H01J 37/32917; H01J 37/26; H01J 37/321; H01J 2237/3321; C01P 2004/04; G01N 1/2813; G01N 1/42
See application file for complete search history.

(56) References Cited

U.S. PATENT DOCUMENTS

| | | | |
|---|---|---|---|
| 2010/0081260 A1* | 4/2010 | Chen | C23C 16/325 257/E21.09 |
| 2014/0014495 A1 | 1/2014 | Dickinson et al. | |
| 2018/0017558 A1 | 1/2018 | Terfort et al. | |
| 2018/0250704 A1 | 9/2018 | Truica-Marasescu et al. | |
| 2023/0131360 A1 | 4/2023 | Russo et al. | |

FOREIGN PATENT DOCUMENTS

| | | |
|---|---|---|
| CN | 108660426 A | 10/2018 |
| JP | 2013239265 A | 11/2013 |
| JP | 2016534508 A | 11/2016 |
| WO | 2006/119521 A1 | 11/2006 |
| WO | 2011/103424 A2 | 8/2011 |
| WO | 2013140822 A1 | 9/2013 |
| WO | 2014/065665 A1 | 5/2014 |
| WO | 2020/041202 A1 | 2/2020 |
| WO | 2020/193719 A1 | 10/2020 |

OTHER PUBLICATIONS

Definition of manifold, accessed online at https://www.merriam-webster.com/dictionary/manifold on Nov. 4, 2024 (Year: 2024).*
Pantelic, R. et al., "The application of Graphene as a sample support in Transmission Electron Microscopy," Support in Transmission Electron Microscopy, Solid State Communications, Elsevier, p. 1375-1382 (2012).
Katerina Naydenova et al.: "Patterned Functionalization of Graphene specimen for CryoEM with a Low-energy Plasma Instrument", Science, Jan. 1, 2014 (Jan. 1, 2014), pp. 1377-1380.
Hernandez et al.: "Controlling the local chemical reactivity of graphene through spacial functionalization", Carbon, Elsevier, Oxford, GB, vol. 60, Apr. 9, 2013 (Apr. 9, 2013), pp. 84-93.
Katerina Naydenova et al.: "Multifunctional graphene supports for electron cryomicroscopy", Proceedings of the National Academy of Sciences, May 24, 2019 (May 24, 2019), 47 pages.
International Search Report and Written Opinion for International Application No. PCT/EP2020/058598, "Graphene Functionalization Method, Apparatus, and Functionalized Graphene Product" dated Jul. 8, 2020.
Search Report for GB Application No. GB1904187.0, "Graphene Functionalization Method, Apparatus, and Functionalized Graphene Product" dated Aug. 6, 2019.
Corrected International Search Report and Written Opinion for International Application No. PCT/EP2020/058598, "Graphene Functionalization Method, Apparatus, and Functionalized Graphene Product" dated Sep. 15, 2020.
Ermantraut, E. et al., "Perforated support foils with pre-defined hole size, shape and arrangement," Ultramicroscopy, 74: 75-81 (1998).
Grant-Jacob, J.A. et al., "Design and fabrication of a 3D-structured gold film with nanopores for local electric field enhancement in the pore," Nanotechnology, 27: 1-11 (2018).
Huang, X. et al., "Amorphous nickel titanium alloy film: a new choice for cryo electron microscopy sample preparation, "bioRxiv, Posted Mar. 2, 2020, doi: https://doi.org/10.1101/2020.03.02.963959; 28 pages.
International Search Report and Written Opinion for International Application No. PCT/EP2021/057628, mailed Jun. 30, 2021.
Janbroers, S. et al., "Preparation of carbon-free TEM microgrids by metal sputtering," Ultramicroscopy, 109: 1105-1109 (2009).
Jia, P. et al., "Large-area freestanding gold nanomembranes with nanoholes," Mater. Horiz., vol. 6; 1005-1012 (2019).
Marr, et al., "Fabrication of carbon films with ~500 nm holes for cryo-EM with a direct detector device", Journal of Structural Biology 185 (2014) 42-47.
Naydenova, et al., "Patterned Functionalization of Graphene Specimen Supports for CryoEM with a Low-Energy Plasma Instrument," post-deadline poster presentation at the Microscopy & Microanalysis 2019 Conference, Aug. 5, 2019, Portland, Oregon.
Naydenova, K. et al., "Multifunctional graphene supports for electron cryomicroscopy," PNAS, vol. 116, No. 24: 11718-11724 (2019).
Russo, C. et al., "Supplementary Materials for Ultrastable gold substrates for electron cryomicroscopy Other Supplementary Material for this manuscript includes the following," vol. 12, Issue 1377, 2014.
Russo, C.J. and Passmore, L.A., "Ultrastable gold substrates for electron cryomicroscopy," Science, vol. 346; Issue 5215; 1377-1380 (2014).
Russo, et al., "Ultrastable gold substrates: Properties of a support for high-resolution electron cryomicroscopy of biological specimens", Journal of Structural Biology 193 (2016) 33-44.
Search Report for GB Application No. GB2004272.7, issued Mar. 10, 2021.

* cited by examiner

GRAPHENE FUNCTIONALIZATION METHOD, APPARATUS, AND FUNCTIONALIZED GRAPHENE PRODUCT

This application is the U.S. National Stage of International Application No. PCT/EP2020/058598, filed Mar. 26, 2020, which designates the U.S., published in English, and claims priority under 35 U.S.C. § 119 or 365 (c) to Great Britain Application No. 1904187.0, filed Mar. 26, 2019. The entire teachings of the above applications are incorporated herein by reference.

FIELD OF THE INVENTION

The present invention relates to a method of functionalizing graphene, an apparatus for conducting such functionalization, and a product featuring such functionalization, and particularly, although not exclusively, to application of those in the field of electron microscopy and particularly cryogenic electron microscopy (also known as electron cryomicroscopy, cryoEM).

BACKGROUND

With recent technological advances, the atomic resolution structure of any purified biomolecular complex can, in principle, be determined by single-particle electron cryomicroscopy (cryoEM). In practice, the primary barrier to structure determination is the preparation of a frozen specimen suitable for high-resolution imaging.

High-resolution structural studies by cryoEM require the biological specimen to be embedded in a thin layer of amorphous water ice[1, 2]. During preparation and cryoplunging, the specimen is exposed to the surfaces of this thin film of water, and thus to potentially detrimental interactions with an air-water interface just before vitrification[1, 3]. These interactions can be ameliorated with the aid of a thin film covering the specimen support[4], which provides an adherent surface for the specimen, but usually at the expense of introducing background noise, movement during imaging, contamination, and uncontrolled specimen-surface forces.

Monolayer graphene has been proposed as a possible support file[5, 6, 7, 8]. However, pristine graphene, due to its hydrophobicity, is not a suitable substrate for preparing cryoEM specimens. Previous work introduced partial hydrogenation with a low-energy plasma as a way of rendering the graphene hydrophilic without damaging the lattice, making it appropriate for cryoEM[8].

There remains a need for improved supports or substrates for cryoEM specimens, and for suitable ways to make them.

The present invention has been devised in light of the above considerations.

SUMMARY OF THE INVENTION

Underlying the present invention is the insight that, by introducing functionalization onto a graphene or graphene oxide film, the surface properties can be tuned with particular application in the field of electron microscopy or cryoEM. Furthermore, the inventors have found that using a helium plasma as carrier for functionalizing compounds gives relatively mild conditions which avoid damage to the graphene during the plasma treatment/functionalization process.

Accordingly, there is presented a new multifunctional specimen support for electron microscopy, for example cryoEM, which may comprise for example large-crystal monolayer graphene or graphene oxide suspended across the surface of an ultrastable gold specimen support. Using a low-energy plasma surface modification system, the surface of this support can be tuned to the specimen by patterning a range of covalent functionalizations across the graphene or graphene oxide layer on a single grid. This support design reduces specimen movement during imaging, improves image quality, and allows high-resolution structure determination with a minimum of material and data.

There are also therefore presented apparatuses for creating such functionalization, and methods for doing so.

In one aspect, there is provided a method of functionalizing graphene or graphene oxide on a substrate for use in electron microscopy, for example cryogenic electron microscopy, the method comprising the step of: (a) exposing a substrate having a layer of graphene or graphene oxide thereon to a plasma comprising helium and at least one functionalizing compound.

In a further aspect, there is provided a method of multiply functionalizing graphene or graphene oxide on a substrate for use in electron microscopy, for example cryogenic electron microscopy, the method comprising the steps of: (a) masking an area of a substrate having a layer of graphene or graphene oxide; (b) exposing the unmasked area to a plasma comprising helium and at least one functionalizing compound, for form a functionalized zone; optionally (c) unmasking the substrate; (d) repeating steps (a) to (c), using a different functionalizing compound in each repeat, to form a substrate having a layer of graphene with multiple zones each having different functionalization.

Accordingly, methods of the present invention may include functionalizing as defined herein, followed by using the functionalized substrate in electron microscopy, for example cryogenic electron microscopy.

In such methods, the time of exposure of the substrate to the plasma may be controlled by use of a shutter fixed over the substrate and movable between an open position, in which the substrate is exposed, and a closed position, in which the substrate is concealed. This allows for greater user control of exposure time, and thus factors such as functionalization degree.

In the present methods, it may be that the functionalizing compound or compounds may be one or more selected from compounds of the following general formula (I):

Formula (I)

wherein each of $R^1$ and $R^2$ are independently selected from the group consisting of H, halo (for example —F, —Cl, —Br), thiol (—SH), amino (—NH$_2$), carboxyl (—COOH) and hydroxyphenyl (—C$_6$H$_4$OH); one of $R^1$ and $R^2$ is not H; and n is an integer from 1 to 10.

In the present methods, it may be that the or each functionalizing compound is one or more selected from the group consisting of amylamine, hexanoic acid, 1-pentanethiol and 4-pentylphenol.

The methods described herein may comprise a further step of exposing the substrate having a layer of graphene or graphene oxide thereon to a plasma comprising hydrogen to effect hydrogenation of the graphene or graphene oxide layer or a portion of the graphene or graphene oxide layer. This may be done before or after functionalization of the graphene or graphene oxide, to provide or supplement the hydrophilicity of the graphene or graphene oxide layer.

In some embodiments, the substrate is a gold cryoEM grid.

An apparatus is provided for performing the methods set out herein.

In a further aspect, the invention provides an apparatus for functionalizing graphene or graphene oxide, optionally by the methods described herein, the apparatus comprising: a plasma generator; a treatment chamber connected to the plasma generator; a substrate holder, positioned to hold a substrate for electron microscopy, for example cryogenic electron microscopy having a graphene or graphene oxide layer thereon within the treatment chamber, and having a mounting area configured to have a substrate mounted therein; an injector, for injecting a functionalizing compound into the treatment chamber; and a helium source, for supplying helium to the plasma generator; and, optionally, a shutter movable between an open position, in which the mounting area of the substrate holder is exposed to the treatment chamber, and a closed position, in which the mounting area of the substrate holder is concealed.

The apparatus may be configured such that, in use, helium is supplied to the plasma generator, helium plasma is generated, has a functionalizing compound injected into it to form a mixture, and a substrate held by the substrate holder is exposed to said mixture in the treatment chamber.

In some embodiments, the apparatus further comprises a mask for masking an area of the substrate. This allows more complex patterning of the substrates with functionalization.

The mask may be moveable, for example during the time during which plasma is present in the treatment chamber. This further enhances the complexity of patterning possible, for example to generate a 'gradient' of functionalization by moving the mask as a given rate in a given direction.

It may be that the mask is removable from the remainder of the apparatus. This allows it to be installed over the substrate(s) outside the remainder of the apparatus, in a more spacious environment for example.

The apparatus is preferably configured such that the mask is not in contact with the graphene or graphene oxide layer of the substrate when the substrate is held in the substrate holder. The mask then does not risk any damage to the substrate. For example, the apparatus may be configured such that the mask is positioned less than 200 μm above the surface of the substrate when the substrate is held in the substrate holder.

The apparatus may further comprise a hydrogen source, for supplying hydrogen to the plasma generator. This allows one apparatus to perform partial hydrogenation of the graphene or graphene oxide as well as functionalization of it.

The apparatus may further comprise a viewport opening into the treatment chamber and a UV-vis spectrometer configured to analyse radiation emitted from the treatment chamber through the viewport.

The apparatus may further comprise one or more functionalizing compound sources, each being connected to the injector, for supplying the functionalizing compound or compounds to the injector.

The apparatus may comprise a plurality of injectors, each injector being connected to a respective functionalizing compound source for supplying the functionalizing compound to the respective injector.

The injector or injectors may be gas injector/s.

Also provided by the present invention is an electron microscopy, for example cryogenic electron microscopy, specimen support, comprising: a metal foil, for example gold, substrate; and a layer of functionalized graphene or graphene oxide on the substrate, the graphene or graphene oxide having multiple different functionalizations. The graphene or graphene oxide may also be partially hydrogenated.

The invention includes the combination of the aspects and features described except where such a combination is clearly impermissible or expressly avoided.

SUMMARY OF THE FIGURES

Embodiments and experiments illustrating the principles of the invention will now be discussed with reference to the accompanying figures in which:

FIG. 7(a) is a representative micrograph of apoferritin particles in vitreous ice on amylamine-functionalized graphene. The scale bar is 500 Å. FIG. 7(b) is a Fourier transform of the motion-corrected micrograph from FIG. 7(a).

DETAILED DESCRIPTION OF THE INVENTION

Figure 1:
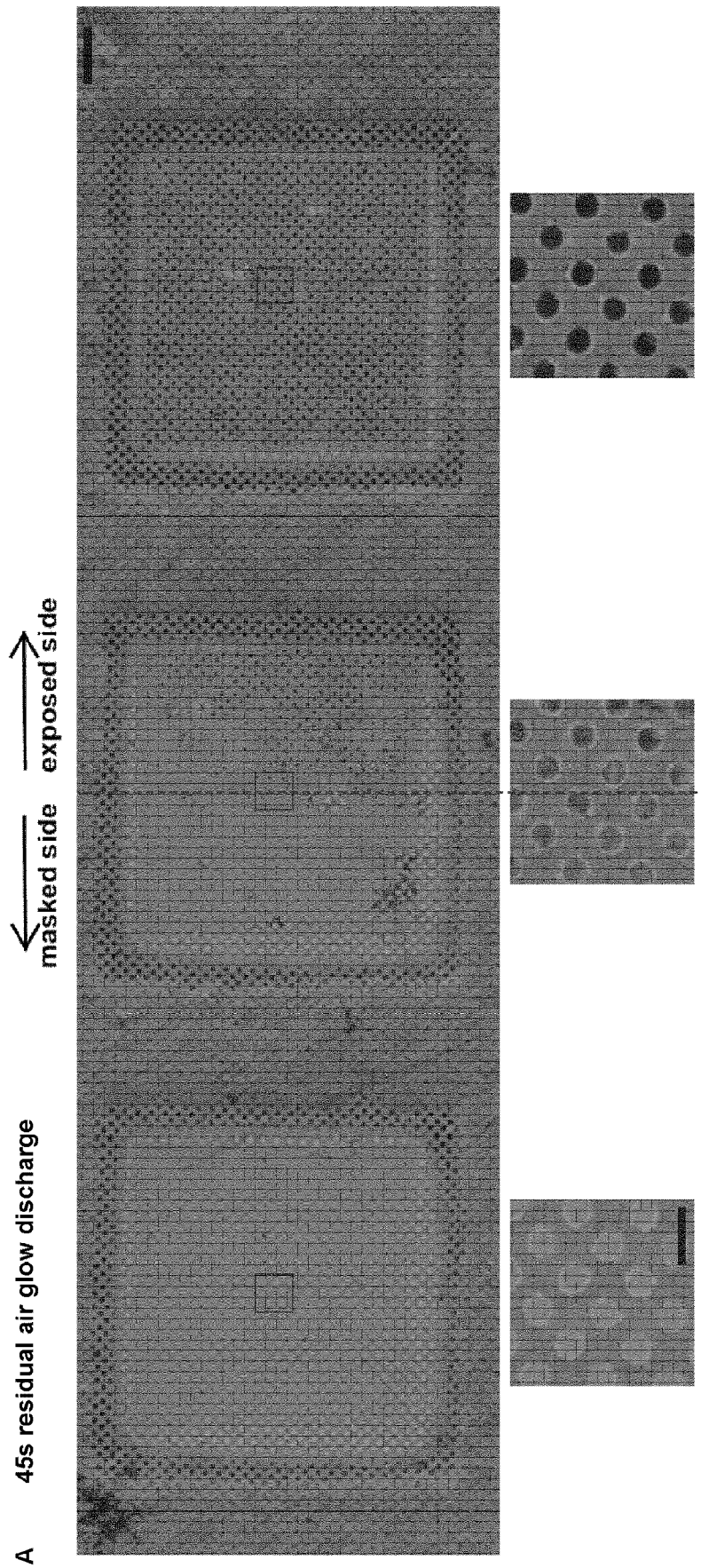
FIG. 1 illustrates the effect of residual air glow discharge and helium plasma on monolayer suspended graphene.
Figure 1:
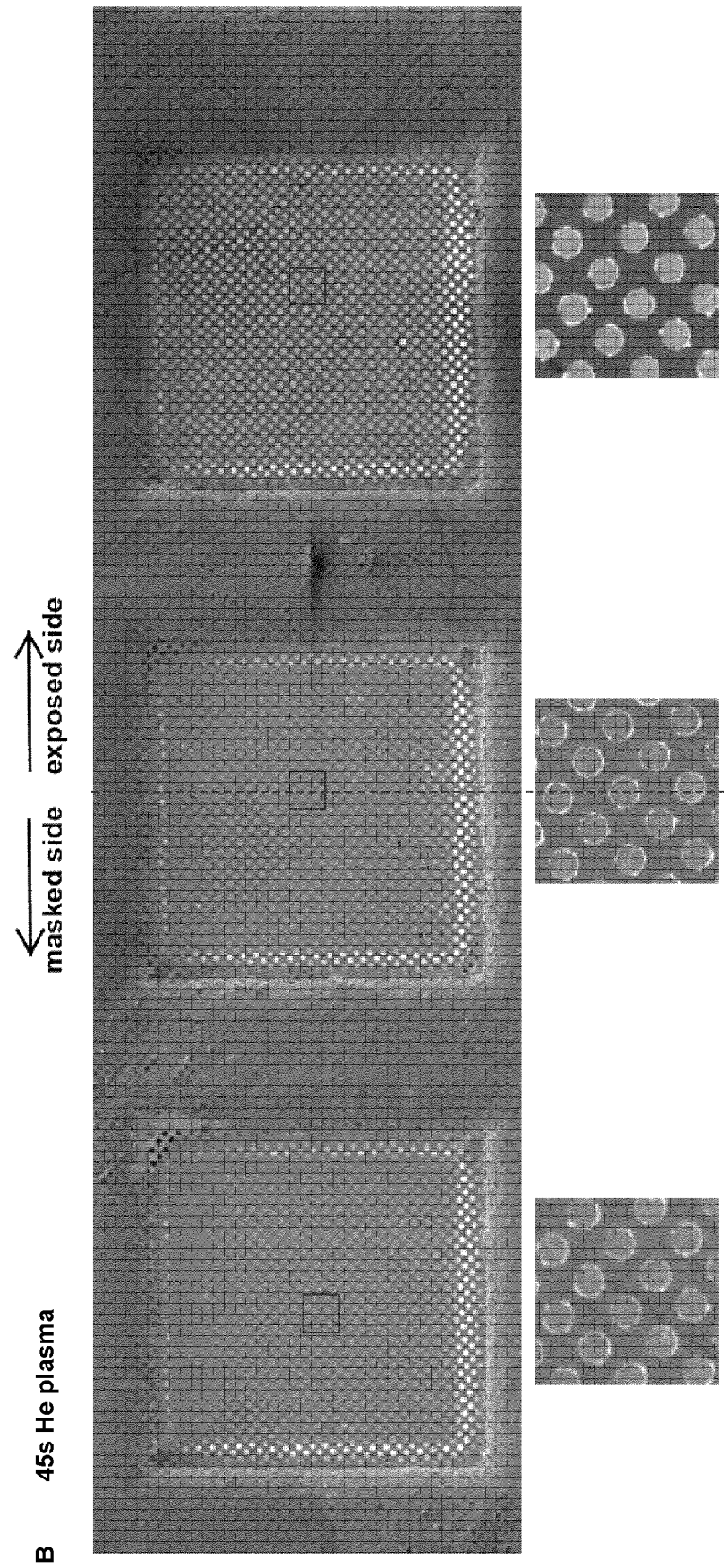
Figure 1:
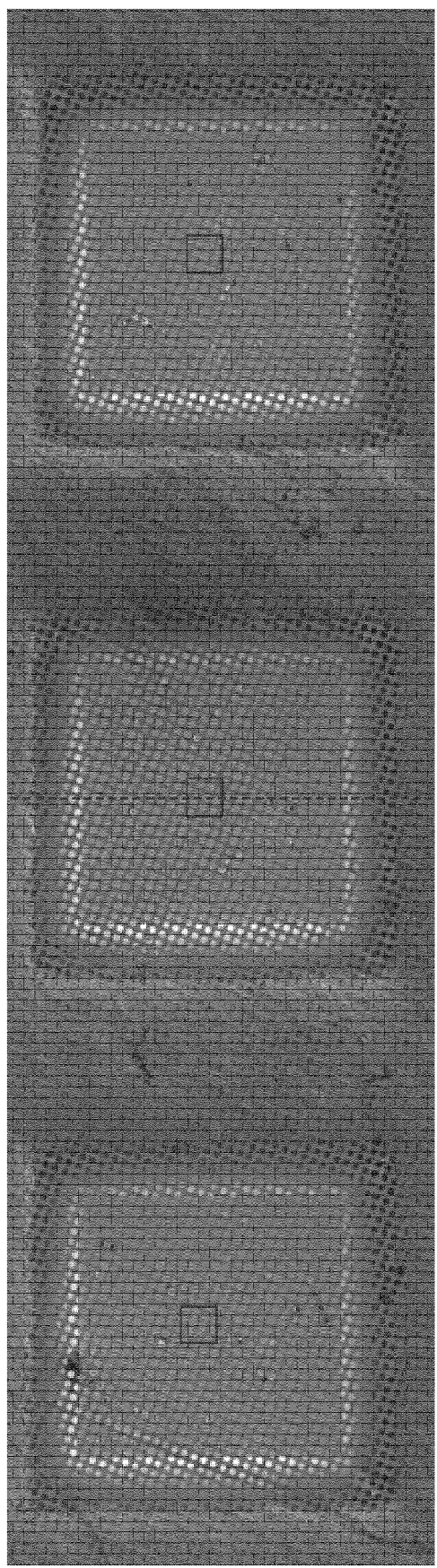
Figure 1:
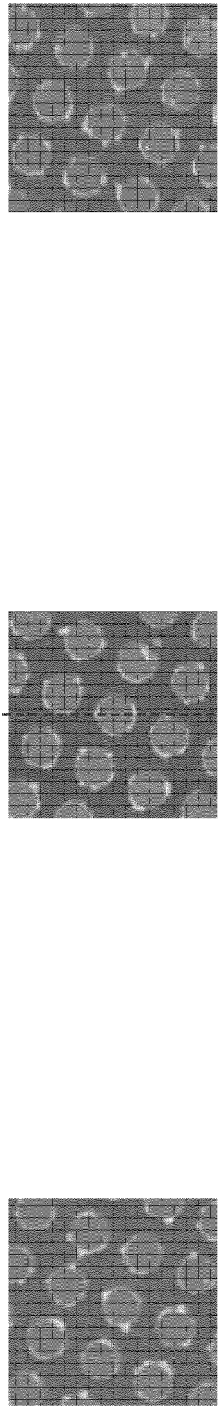

Aspects and embodiments of the present invention will now be discussed with reference to the accompanying figures. Further aspects and embodiments will be apparent to those skilled in the art. All documents mentioned in this text are incorporated herein by reference.

Graphene

Graphene as a material is well known in the art, as its manufacture. The main known methods are 'top-down' or 'bottom-up' syntheses, being conducted broadly either by exfoliating layers from graphite or depositing carbon structures to synthesise the graphene structure, for example by chemical vapor deposition (CVD).

When discussing the graphene layer herein, it is considered that either a monolayer or few-layer graphene is encompassed. For example, the graphene layer may be a single (mono)layer of graphene, or it may consist of 2-5 sheets of the graphene structure.

Preferably the graphene is monolayer. Such graphene approaches invisibility in the resolution range of interest in cryoEM.

As explained herein, the functionalized graphene layer is on a substrate which may itself have holes in it, for example a holed gold foil on a gold mesh or grid. In such cases, the graphene crystals in the layer are preferably each larger than one opening or square of the mesh/grid. For example, each graphene crystal may have a smallest 2D-dimension (not thickness) of at least about 50 μm. Each graphene crystal may be of a hexagonal shape.

Where the substrate has holes in it, the graphene is of course not directly 'on top of' substrate material in those holes. In such a case the graphene may be referred to as suspended. That is, it is in contact with the substrate in some places and not in other, where the substrate has a hole, the graphene layer spanning that hole.

Reducing the number of graphene crystal grain boundaries in the graphene layer may be advantageous. For example, this may increase the mechanical and chemical robustness of the graphene layer for during the functionalization process (described herein) and during cryoEM imaging.

The present methods, apparatuses, uses and products may alternatively utilize a graphene oxide layer instead of a graphene one. That is, the present method may be applied in order to functionalise a graphene oxide layer on a substrate; the products of the invention may comprise a functionalized graphene oxide layer and so on. All preferences and options discussed with respect to graphene can be applied to graphene oxide embodiments as appropriate.

Functionalization

The graphene layers described herein are functionalized. The present inventors have found numerous advantages associated with such functionalization.

Pristine graphene, due to its hydrophobicity, is not a suitable substrate for preparing cryoEM specimens; previous work introduced partial hydrogenation with a low-energy plasma as a way of rendering the graphene hydrophilic without damaging the lattice, making it appropriate for cryoEM. Still, the present inventors have found that partially hydrogenated graphene provides only a single type of adherent surface, which is not sufficient for all possible specimens. By introducing and controlling functionalization, a range of specimens can be supported in a variety of spatial orientations, greatly enhancing the efficiency of the cryoEM analysis process.

Furthermore, knowledge of how a purified protein interacts with other well defined surfaces, like those present in ion exchange columns, will help guide appropriate functionalization and buffer conditions for a particular cryoEM specimen. Besides being a tuneable surface for improving specimen orientation in cryoEM, functionalized graphene provides a novel method of mapping and quantifying the interaction surface of a particular biomolecule.

Functionalized graphene surfaces can be used to orient and distribute biological molecules within a thin vitreous ice film, and they reduce the motion of the specimen, improving the image quality.

When discussed herein, 'functionalized' graphene refers to graphene which has one or more chemical groups other than hydrogen covalently bonded to its structure. That group can be referred to as a functionalization. Often those groups are derived from hydrocarbon based compounds, from which a hydrogen atom has been removed at the site of attachment/bonding to the graphene structure. That is, the functionalizing compound is generally one corresponding to the desired functionalization, with an H— at the site of graphene bonding.

When discussed herein, the functionalizing compound and functionalization corresponding to that are not particularly limited and can be selected according to desired effects of the functionalized graphene and the vapor pressure of the functionalizing compound.

Where the plasma functionalization technique describe herein is used, in principle the functionalization can be with any small molecule compound provided it has a vapor pressure sufficient to inject into the chamber. It is noted that, there, the orientation and length of the functional groups is not specifically controlled, implying there will possibly be a mixture of functional fragments on the surface. That is, the specific functionalizations may not be uniform even where a single functionalizing compound is used.

Possible examples are set out in Table 1 below, but of course variation of those can be envisaged.

TABLE 1

Examples of functionalizing compounds and corresponding typical functionalization[11]

| Name | Structure of functionalizing compound | Typical Functionalization | Molecular Weight (Da) | Vapor pressure at 25° C. (Torr) |
|---|---|---|---|---|
| Pentylamine | ~~~NH₂ | ~~~NH₂ | 87.16 | 30 |
| 1-pentanethiol | ~~~SH | ~~~SH | 104.21 | 14 |
| Hexanoic acid | ~~~COOH | ~~~COOH | 116.16 | 0.2 |
| 4-pentylphenol | ~~~C₆H₄OH | ~~~C₆H₄OH | 164.25 | ~0.02 |

In Table 1, the location of the bond to the graphene is shown by: \

For example, the functionalizing compound is a hydrocarbon optionally substituted at one or more positions with a functional group, preferably a reactive functional group.

The functionalizing compound may for example be $C_{1-10}$ alkyl, suitably $C_{3-6}$ or $C_5$ alkyl, optionally substituted with one or more groups selected from halo (for example —F, —Cl, —Br), thiol (—SH), amino (—NH$_2$), carboxyl (—COOH) or hydroxyphenyl (—C$_6$H$_4$OH). It may be a compound having a vapor pressure, at 25° C., of 0.01 to 50 Torr.

In practice, the vapour pressure of the compound may be increased or decreased to an appropriate level by heating or cooling the compound and/or the injection system. A suitable range of temperatures to which it or they are cooled are heated is −60° C. to +200° C.

In cryoEM focussed embodiments, appropriate functionalizing compounds include those which have a terminal first functional group with similar properties to those of the amino acid side chains which a biological molecule might encounter in vivo. Such functional groups include amines, thiols, carboxyls, phosphates, sugars and other functional groups which are present in the native aqueous environs of the cell. Said compounds might also have a second functional group which can react with graphene to form an SP3 (covalent) bond. The second functional group may also be unlikely to react with the first functional group. The second functional group may also be terminal.

These two functional groups, where both present, may be separated by a hydrocarbon chain, preferably saturated, which separates the first functional group from the graphene surface yet is unreactive otherwise. The length of said chain is restricted by the vapor pressure—as the chain length increases the vapor pressure decreases and eventually becomes prohibitively low to be injected in the chamber even with heating. So the optimal chain length is one which provides some separation from the graphene surface but still comprises a compound whose vapor pressure is in a reasonable range for injection into the plasma chamber.

The functionalizing compound or compounds may be one or more selected from compounds of the following general formula (I):

Formula (I)

wherein each of $R^1$ and $R^2$ are independently selected from the group consisting of H, halo (for example —F, —Cl, —Br), thiol (—SH), amino (—NH$_2$), carboxyl (—COOH) and hydroxyphenyl (—C$_6$H$_4$OH);
one of $R^1$ and $R^2$ is not H; and
n is an integer from 1 to 10.

In some embodiments n is an integer from 3 to 6, for example 5.

In some embodiments, $R^2$ is H and $R^1$ is selected from the group consisting of halo (for example —F, —Cl, —Br), thiol (—SH), amino (—NH$_2$), carboxyl (—COOH) and hydroxyphenyl (—C$_6$H$_4$OH).

In some embodiments $R^2$ is H.

In some embodiments, $R^1$ is selected from carboxyl or thiol. In some embodiments $R^1$ is thiol.

In the functionalized graphene, for example, 0.001 to 10% of carbon atoms in the graphene structure are bonded to a functionalization; that is, the graphene may be 0.001 to 10% functionalized, for example 0.1 to 1% functionalized.

Functionalization may be at a density of around 0.5-5 functionalizations per nm$^2$ of the graphene, for example 1-2.

Functionalization with a reactive group-containing compound, such as a thiol-containing compound, may be preferred, because the thiol group can be easily subject to further reaction to link more complex structures to the functionalized graphene. For example, it may be desirable to link certain ligands or known bonding groups onto the graphene surface using the short, flexible hydrocarbon chains discussed above.

Graphene which has hydrogen bonded covalently within its structure may be referred to as hydrogenated graphene. In general not every site is bonded to hydrogen and so the level of hydrogenation is partial. Partially hydrogenated graphene is known in the art. Herein, where partial hydrogenation of graphene is discussed, suitably around 0.001 to 10% of carbon atoms in the graphene structure are bonded to hydrogen; that is, the graphene may be 0.001 to 10% hydrogenated, for example 0.1 to 1% hydrogenated.

In certain circumstances partial hydrogenation is preferable. Partially hydrogenated graphene is more hydrophilic than pristine graphene. Such hydrophilic behaviour may be preferred. Therefore, where the graphene has at least one functionalization which is not hydrophilic (that is, that is hydrophobic) it may be preferred to also have partial hydrogenation.

For example, where the graphene is functionalized with a functionalization derived from a carboxyl or thiol it tends to be hydrophobic, and so partial hydrogenation can assist with making the functionalized graphene hydrophilic.

Hydrophilicity of this type is particularly useful in the cryoEM field, where specimens in water are analysed.

A functionalized graphene may have one or more type of functionalization, as well as optionally being partially hydrogenated. A graphene having more than one type of functionalization may be referred to as multifunctional, or multiply functionalized. A functionalized graphene may or may not also be partially hydrogenated.

For example, a functionalized graphene may be functionalized with one or more (or exactly one), two or more (or exactly two), three or more (or exactly three) or four or more (or exactly four) functionalizations. Those may be selected from the functionalizations set out in Table 1 above.

It may be preferable for a functionalized graphene to be divided into a number of zones or regions, each of which has a different level, type, or combination of functionalizations. In this way a single substrate with a functionalized graphene layer can, for example, be used to 'hold' a biological specimen in a variety of configurations by appropriate selection of the different functionalizations and hydrogenations of the different zones.

For example, a substrate with a graphene layer may be divided into four zones or regions, a first zone having a first level and type of functionalization and (partial) hydrogenation; a second zone having a second level and type of functionalization and (partial) hydrogenation; a third zone having a third level and type of functionalization and (partial) hydrogenation; and a fourth zone having a fourth level and type of functionalization and (partial) hydrogenation.

It will be understood that in such a zonal arrangement all of the above discussed options and possibilities for the functionalizations and hydrogenations still apply, independently within each zone or to the functionalized graphene as a whole.

Such multifunctionalization, and in particular zonal functionalization, is advantageous as it means that grids on which every square has a distinct functionalization and surface property or linker chemistry are possible. It means that, for example, one can simultaneously test multiple conditions for the same biological specimen on a single grid.

Substrate

In one aspect, the present invention relates to substrates with a functionalized graphene (or graphene oxide) layer thereon, for example metal and particularly gold substrates with such a layer. As explained herein, the layer and its functionalization can be varied without particular limitation as regards the substrate.

[Herein, the word "support" is used to refer to the substrate+graphene layer combination; in some embodiments, the article onto which the specimen for cryoEM analysis is placed.]

In embodiments of the invention, the substrate may be, for example, metal such as a nickel, copper or gold article, such as a foil. In particular it may be a gold-based substrate.

As described herein, a substrate of a type known for supporting a cryoEM specimen may be particularly preferred. Examples are known in the art, but herein described is a gold-based substrate. Such substrates are preferred for their stability[10], structural integrity and tensile strength, and also because they provide good electrical contact to graphene even at cryogenic temperatures.

Such a substrate may be a 'gold-on-gold' or 'all gold' type. Such a substrate comprises a gold mesh, in an arbitrary (but generally flat) shape, for example a disc or square plate. Each such mesh is, for example, a disc of diameter 1-5 mm, or a plate each side of which is 1-5 mm long. The mesh has, for example, 100-500 lines/inch. This leads to it having a series of, for example, roughly square or hexagonal openings. This may also be referred to as a 'grid'.

On top of the gold mesh is a further gold foil (hence the terminology gold-on-gold). The foil itself spans each of the mesh openings. The foil itself has holes in it, each of which has a size of 1 μm or less, for example 0.01 to 0.5 μm in diameter. The foil is thin, for example 100-1000 Å in thickness.

Such substrates are well known in the art. The present invention adds a layer of functionalized graphene or graphene oxide on top of or underneath the gold foil, onto which the specimen for cryoEM analysis can be placed.

Figure 11:
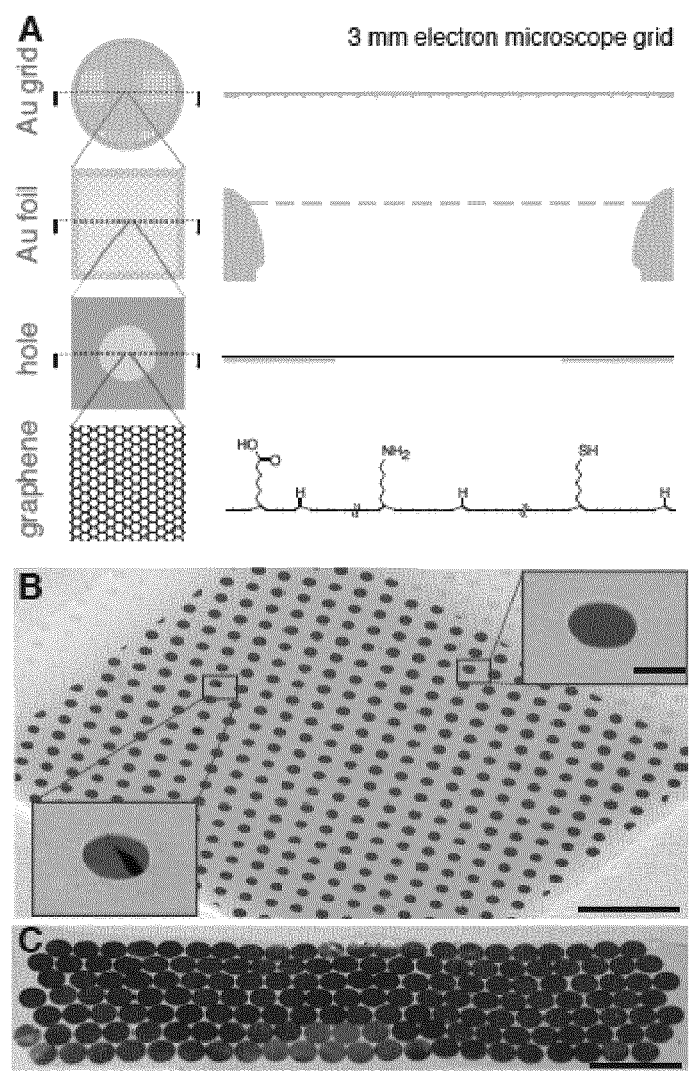
FIG. 11 illustrates (a) schematically the support, a gold-on-gold substrate with a graphene layer thereon; (b) a grid square covered by the suspended graphene film; and (c) a number of batch produced graphene-coated all-gold grids.

An example is illustrated in FIG. 11. In part (a) there, it is shown that the example gold-on-gold substrate comprises a 3 mm disc of gold mesh ("Au grid") with 300 lines/inch where a ≈500 Å thick gold foil ("Au foil") with a regular array of sub-micron sized holes is suspended across the square openings in the mesh. The graphene layer (here, a monolayer) is deposited on top of the gold foil, covering all holes ("hole"). As explained herein, the graphene can be covalently functionalized by exposure to a low-energy helium plasma containing hydrocarbon precursor molecules ("graphene", dots represent different functional groups). The specimen (material for cryoEM analysis) is applied to the graphene side of the grid and is vitrified to form a continuous ice layer which can be imaged through the holes.

Part (b) of FIG. 11 shows how a grid square is covered by the suspended graphene film (secondary electron micrograph). The scale bar is 10 μm. The insets show a completely covered hole (upper), and a hole with broken graphene (lower), both magnified 5× (the scale bar is 1 μm). As shown in FIG. 11(c), a single growth and transfer batch yields more than 150 graphene-coated all-gold grids with >95% coverage (the scale bar is 10 mm).

Functionalization Method and Apparatus

The present inventors have developed a method for creating substrates with a functionalized graphene (or graphene oxide) layer thereon, and an apparatus for performing such a method. The substrate, graphene and functionalization may of course be as described herein.

In particular, the inventors have found that by using helium (which is inert and has a low atomic number) as the primary plasma gas with a remote plasma generator, sputter damage and other changes to the graphene are prevented while chemical reactions between the graphene and the chemical precursors (functionalizing compounds) are enabled. This is in contrast to typical residual air glow discharge systems used for cryoEM which create a plasma with sufficient energy to destroy the suspended monolayer graphene even with short exposures.

This is demonstrated in FIG. 1. FIG. 1 illustrates the effect of residual air glow discharge and helium plasma on monolayer suspended graphene. It presents a scanning electron micrograph of graphene-coated all-gold grids after 45 s exposure to residual air glow discharge (negative bias, 15 mA at 0.3 Torr in PELCO easiGlow) (FIG. 1(a)); 45 s exposure to low-power helium plasma (9 W forward power at 1 Torr in Fischione 1070) (FIGS. 1(b)); and 4500 s exposure to the same helium plasma (FIG. 1(c)). The scale bar is 10 μm.

The grids were covered by a non-contact knife-edge half-mask during the exposure, the approximate location of the mask edge is indicated with the dashed line. The graphene exposed to the glow discharge is destroyed and the non-covered holes in the gold foil appear black (see FIG. 1(a), right). The helium plasma does not affect the structural integrity of the graphene film, even after exposures more than 100 times longer than the typical for functionalization. The shadow of the mask edge is visible across the middle square in FIG. 1(a), indicating that the patterning resolution of this masking method is <50 μm. The insets show 5× magnified views of the squared areas. The scale bar for the insets is 2 μm.

As such, the inventors have identified helium (He) as an excellent plasma carrier for graphene functionalizing compounds, especially for functionalizing graphene layers of cryoEM substrates. The plasma is relatively gentle, as it does not damage or react with the graphene layer while at the same time being high enough energy to effect functionalization with the functionalizing compounds.

A plasma of the functionalizing compound/s alone would be excessively aggressive, and risk damaging the integrity of the graphene layer as well as or even instead of functionalizing it as desired. Furthermore use of such a plasma would leave polymer side products deposited in the reaction chamber (depending on the functionalizing compounds present). Similarly, a hydrogen plasma reacts with the graphene layer to hydrogenate it and so is not as suitable.

Therefore in the functionalization treatment described herein it is preferred that helium is the primary plasma component. That is, 50% or more, 60% or more, 70% or more, 80% or more, 90% or more or 95% or more of the atmosphere used to treat the graphene layer on the substrate may be helium plasma.

The power of the plasma used for this functionalization treatment may be, for example, 0.1 to 100 Watts, for example 1 to 20 Watts or 5 to 15 Watts.

The remainder may include, for example, hydrogen plasma to impact partial hydrogenation, and one or more functionalizing compounds as described above. Those compounds may be in vapor, gas or plasma form. In this was the helium plasma is effectively dilutes the other reactive components.

The treatment time and conditions may be selected appropriately for the desired level of functionalization. For example, an exposure time of 10-60 seconds to the functionalizing plasma (He plasma+one or more functionalizing compounds) may be appropriate.

For partial hydrogenation, a hydrogen plasma can be used[8]. It may be used alone or in combination with a helium plasma. Again, the treatment time and conditions may be selected appropriately for the desired level of hydrogenation. For example, an exposure time of 30-300 seconds, for example 150-210 seconds, to hydrogen plasma may be appropriate to render a graphene layer hydrophilic.

A typical plasma pressure is 0.1 to 10 Torr, for example 0.5 to 1 Torr. This applies to any plasma described herein, although an appropriate pressure may be selected depending on the plasma used, and additive functionalizing compound, the intended effect on the graphene layer and so on.

Such a hydrogenation treatment, with hydrogen-containing plasma, may be carried out before or after the functionalizing treatment, with helium plasma and functionalizing compound/s. In some embodiments it is carried out before the helium plasma treatment.

The present inventors have found that by selectively masking and unmasking areas of the substrate, multiple functionalization can be easily achieved and the different zones of functionalization accurately controlled. By masking an area before a given treatment with plasma, the unmasked area is affected. Then, the mask can be removed, that is, the substrate unmasked, and a different masking done, followed by a different treatment with plasma. The same or a different mask can be used. Alternatively a further mask can be added to the previous, followed by the different treatment with plasma, to effect differing treatment depending on the sequence of masks used.

Another possibility is that the mask is moveable during the functionalization process. Depending on the design of the mask, this can allow a given functionalization in a restricted area or pattern (for example, if the mask is effectively a hole which is moved across the substrate, selectively exposing a path on the substrate to functionalization). This enables to 'write' one or more paths or patterns of one or more functionalizations on the substrate.

Other mask shapes moved on the substrate during functionalization may give, for example, a gradual change of functionalization on the substrate. Those areas initially uncovered by the mask will be exposed to functionalization treatment for longer than those exposed for a shorter time, leading to a gradient of functionalization degree. Other variations of this can easily be envisaged.

The movement of the mask may be done continuously throughout functionalization treatment. Alternatively, the mask may be moved stepwise to give more distinct changes of functionalization.

Accordingly there is described herein a method of functionalizing suspended graphene or graphene oxide on a substrate, the method comprising the steps of: (a) masking an area of a substrate having a layer of graphene or graphene oxide; (b) exposing the unmasked area to a plasma comprising helium and at least one functionalizing compound, for form a functionalized zone; and (c) altering the masking of the substrate, for example by moving, adding to or replacing the mask. Step (c) may be performed during or after completion of step (b). It may be followed by a further step repeating (b) with a different functionalizing compound.

By repeating this method, using simple or complex masks as desired, a desired series of zones can be built up with varying functionalization and/or hydrogenation. Multiple exposures allow multi-axis patterning and serial patterning of the same region with multiple functionalizations.

This same patterning method also enables one to directly evaporate, for example, amorphous carbon onto a, for example, 100 µm diameter region in the centre of the substrate. This may be useful for stigmation and coma alignments on the multifunctional grid prior to high-resolution data collection.

The masks themselves may have any shape selected for the appropriate masking. For example, the mask may be a half-mask which covers 50%, for example one complete half side, of the substrate. One mask can be used, removed, and then reapplied in a different orientation; or a new or differently shaped mask can be used.

The mask may have at least one 'knife edge', that is, be sharpened from its main thickness to a gradually thinned thickness to its edge. The knife edge is suitably at an edge intended to lie on/over the substrate. An example is illustrated in FIG. 12(c).

The mask may be positioned slightly above the surface of the substrate, for example less than about 200 µm, for example about 20-100 µm, above the substrate surface. A greater distance gives a less defined boundary of plasma treatment, and so the distance from the substrate to the mask can be increased to give smoother surface patterning transitions or gradient functionalization, for example. Of course, the distance can be reduced if a more distinct boundary between the treatment and non-treated areas is wanted.

At the typical plasma process pressure of ~1 Torr, and with ≈50 µm mask-to-surface spacing, the resolution of this patterning method is approximately 50 µm or 1 grid square.

Preferably the mask it not in contact with the graphene layer on the substrate when it is applied. This minimises the risk of damage.

The mask itself may be in the form of a plate, with a series of holes or designs cut or otherwise patterned into it. Those holes lie over the substrate(s) in use to give the desired masking pattern. Some or each of those holes may have a knife edge.

For example, in FIGS. 12(b) and (c) it can be seen that there is a mask with 10 half-moon (semicircular) holes therein, to provide 10 half masks for 10 disc shaped substrates.

Figure 12:
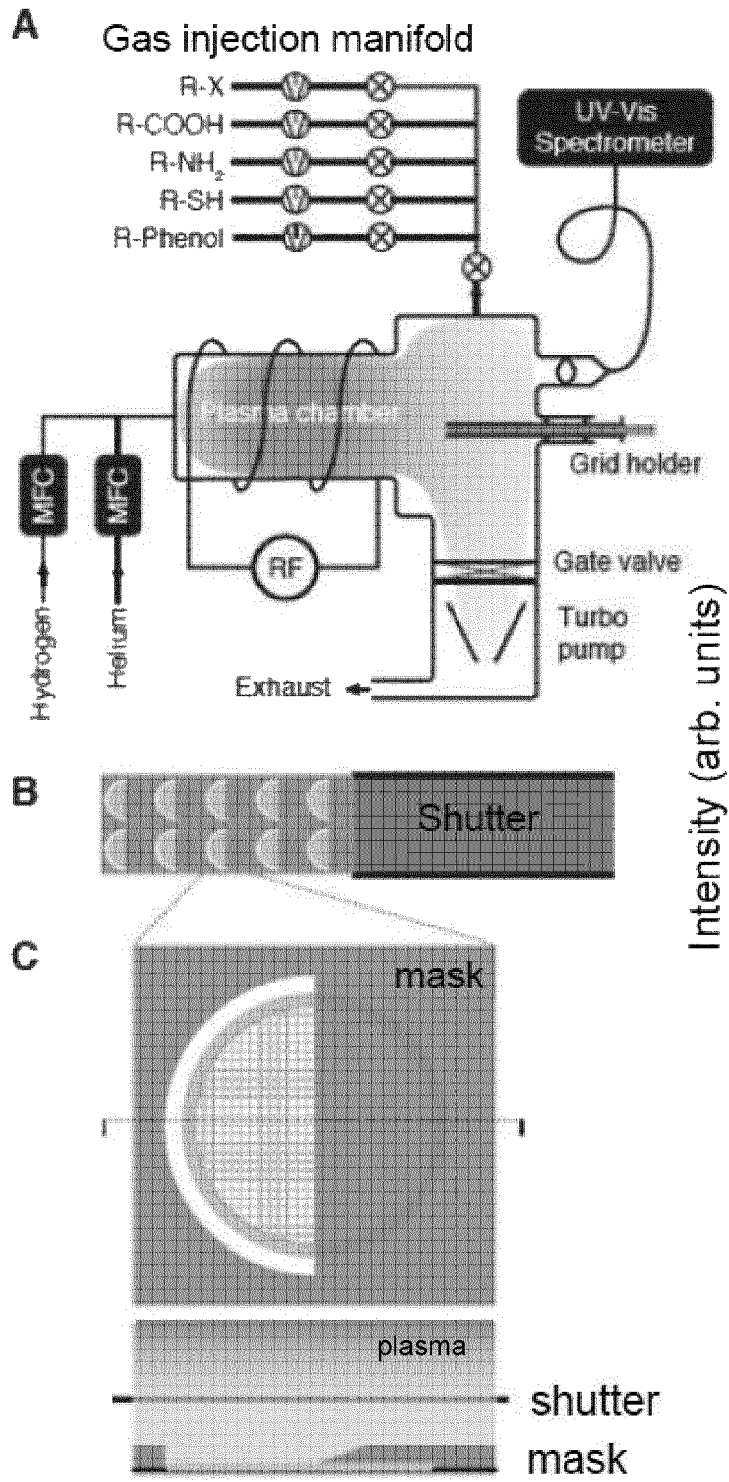
FIG. 12 illustrates (a) schematically, the design of an inductively coupled plasma instrument for covalent functionalization of graphene; (b) a slotted grid holder; (c) a non-contact knife-edge mask design for patterning of graphene grids with plasma-assisted functionalizations; (d) optical spectra of pure helium carrier plasma (black) and with introduced vapors of chemicals for functionalization; (e) XPS spectra of functionalized graphene showing chemical modifications.
Figure 12:
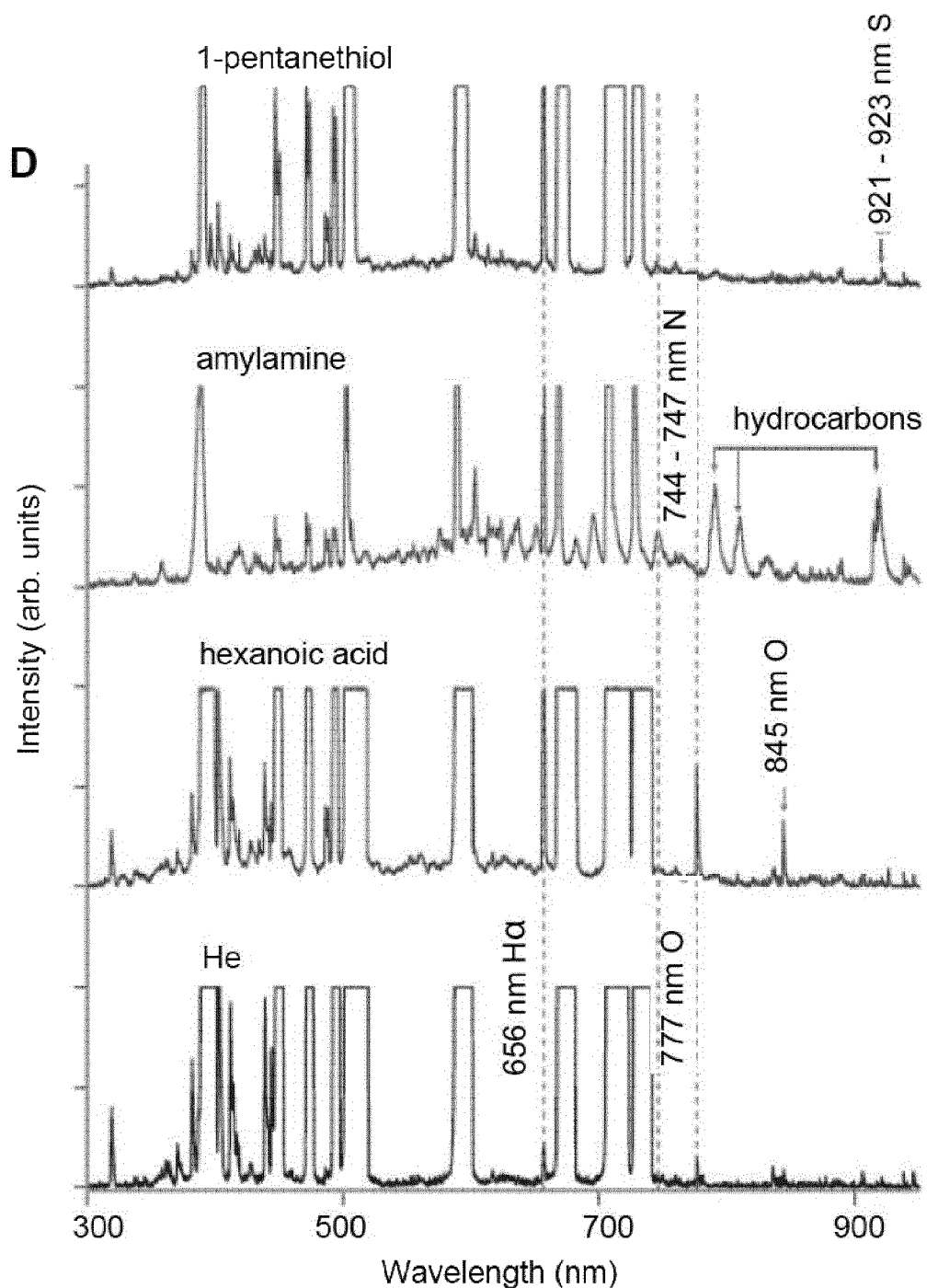
Figure 12:
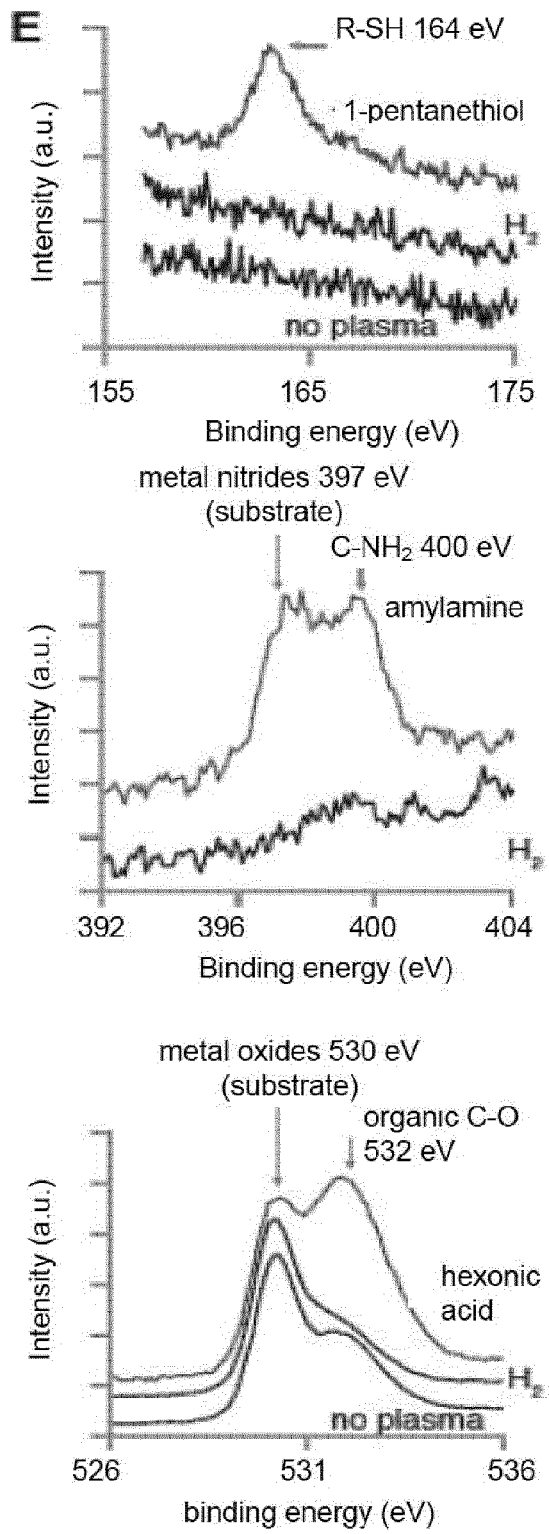

FIG. 12 shows aspects relating to the covalent graphene functionalization and patterning with a low-energy helium plasma. FIG. 12(a) illustrates schematically the design of an inductively coupled plasma instrument for covalent functionalization of graphene. FIG. 12(b) illustrates schematically the slotted grid holder positions reliably and precisely up to 10 grids under a single mask plate. The retractable shutter is used to control the exposure time independent of establishing a stable plasma reaction condition in the chamber. FIG. 12(c) shows a non-contact knife-edge mask design for patterning of graphene grids with plasma-assisted functionalizations. Masks with arbitrary shapes are possible. FIG. 12(d) shows optical spectra of the pure helium carrier plasma (lowest spectrum) and with introduced vapors of chemicals for functionalization. The He spectral lines are saturated to make the other peaks, corresponding to the atomic species from the precursors, visible. The Hα spectral line at 656 nm is used to monitor the breakdown of the hydrocarbon precursor in real time. FIG. 12(e) shows XPS spectra of functionalized graphene showing chemical modifications.

A suitable functionalization apparatus of FIG. 12(a) can be further described. At its broadest, the apparatus comprises a plasma generator; a treatment chamber ("plasma chamber") connected to the plasma generator; a substrate holder ("grid holder"), positioned to hold a substrate having a graphene layer thereon within the treatment chamber, and having a mounting area configured to have a substrate mounted therein; an injector ("gas injection manifold"), for injecting a functionalizing compound into the treatment chamber; and a helium source, for supplying helium to the plasma generator. Also provided by the present invention is the use of an apparatus (as described herein) in the functionalization of graphene (or graphene oxide), in particular in the functionalization of a graphene (or graphene oxide) layer on a substrate as described herein or a support as described herein.

So, described herein is use of an apparatus for functionalizing graphene, the apparatus comprising: a plasma generator; a treatment chamber connected to the plasma generator; a substrate holder, positioned to hold a substrate having a graphene layer thereon within the treatment chamber, and having a mounting area configured to have a substrate mounted therein; an injector, for injecting a functionalizing compound into the treatment chamber; and a helium source, for supplying helium to the plasma generator.

Such an apparatus is configured such that, in use, helium enters the plasma generator and a helium plasma is formed in the treatment chamber; the functionalizing compound/s are injected into the treatment chamber, and the graphene layer on a substrate held by the substrate holder is thus functionalized.

The apparatus may have various other features. For example, as appropriate, it may also comprise a hydrogen source, for supplying hydrogen to the plasma generator. That hydrogen source may be linked to the plasma generator so that hydrogen enters by the same route as helium from the helium source;

alternatively, respective inflow points may be provided. Each hydrogen or helium source present may be controlled with a mass flow controller ("MFC").

The apparatus may optionally further comprise an oxygen source, for supplying oxygen to the plasma generator. This can be used to generate oxygen plasma in order to clean the treatment chamber and apparatus in between functionalization treatments. Ideally the substrate is not present in the treatment chamber when oxygen is supplied to the plasma generator.

That oxygen source may be linked to the plasma generator so that oxygen enters by the same route as helium from the helium source and/or hydrogen from the hydrogen source, if present; alternatively, a respective inflow point may be provided. Each oxygen source present may be controlled with a mass flow controller ("MFC").

The plasma generator may be, for example, an inductively couple plasma generator of known type, for example and RF plasma generator. The injector may be, for example, a gas injector, or other injector suitable for the type(s) of functionalizing compound(s) to be injected.

The apparatus may be configured to inject multiple different functionalizing compounds. The apparatus may comprise a source for each functionalizing compound. The sources of each functionalizing compound may use a common injector, or may each be provided with a respective injector into the treatment chamber. If there is a common injector, each functionalizing compound source may have a control to adjust the flow of the functionalizing compound to the shared injector. This allows great control of the flow of and thus functionalization by the various functionalizing compounds.

In the methods, apparatuses and uses described herein, a suitable flow rate of each functionalizing compound into the treatment chamber, or into the plasma, may be for example 1 to 1000 sccm, optionally 10 to 100 sccm.

That is, at conditions of 0° C. and 100 kPa, the flow rate of each functionalizing compound is for example 1 to 1000 cm$^3$/min, optionally 10 to 100 cm$^3$/min, that is 0.1667 cm$^3$/s to 16.667 cm$^3$/s, optionally 0.1667 cm$^3$/s to 1.667 cm$^3$/s.

There may be a UV-vis spectrometer attached to the apparatus, observing the treatment chamber through a viewport, for example a sapphire viewport. This allows monitoring of the plasma conditions within the treatment chamber.

The treatment chamber also may have known features such as a gate valve and exhaust, for example a pump driven exhaust. Exhaust of the plasma chamber can be restricted with a "butterfly valve" or similar to limit the pump speed and control the pressure in the plasma (treatment chamber) independent of the input gas flow rate and composition. The apparatus and or exhaust system may also include a real-time feedback loop on pressure to control this independent of input flow rates. That is, depending on the flow rates of plasma sources (helium and/or hydrogen, or oxygen) and functionalizing compound source(s) into the treatment chamber, the exhaust flow rate may be increased or decreased automatically to maintain a desired pressure in the treatment chamber.

The apparatus may also have a shutter movable relative to the mounting area of the substrate holder between an open position, in which the mounting area of the substrate holder is exposed to the treatment chamber, and a closed position, in which the mounting area of the substrate holder is concealed. An example of such a shutter is illustrated in FIG. 12(b).

That is, either the shutter itself may be moved to reveal or conceal the mounting area of the substrate holder, or the substrate holder itself may be moved to achieve the same revealing and concealing of it. This movement of the shutter and/or the substrate holder may be controlled from outside the treatment chamber.

The substrate holder itself may be configured to hold multiple substrates as described herein. The examples in FIG. 12(b) is holding 10 substrates, for example. The substrate holder may itself comprise a portion for receiving the substrate (a mounting area), a portion for receiving a mask, and a portion for receiving the shutter mechanism. Of course it may be integrally formed with the shutter, and/or a mask as described herein.

When the shutter is closed and the mounting area (and thus the substrate or some or all of the substrates) concealed, the concealed substrate/s can no longer be affected by the plasma atmosphere. By controlled opening of the shutter to reveal one or more of the substrates (that is, to partially or completely reveal or expose the mounting area), functionalization or hydrogenation at the reveal portion can be begun as desired. This allows for the time of functionalization or other plasma treatment to be carefully controlled. For example, some substrates can be exposed for a longer period of time than others. This provides a further option for quickly creating a number of substrates with differing functionalization or hydrogenation degree or type.

The apparatus may itself comprises one or more pre-made masks as described herein. In such a case, the substrate(s) need only be loaded into the substrate holder, or mounting area thereof, and the apparatus mask, and optionally shutter, can be applied to them for use in the treatment chamber.

Where the apparatus comprises a mask, it may further comprise means for moving the mask during functionalization treatment or between functionalization treatments.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

EXAMPLES

Throughout the examples a substrate having a layer of graphene, as described herein, is used. All-gold-supports or substrates (UltrAuFoil R 0.6/1, 300-mesh, Quantifoil) with 800 nm hole diameter were used, with a graphene monolayer thereon, for functionalization. Those supports or substrates may be referred to as grids.

Supports comprising such a substrate with a layer of graphene thereon can be prepared by techniques available in the art, for example by CVD growth of graphene on a copper foil followed by transfer of the graphene layer to the gold substrate.

Example 1—Graphene Functionalization (a) Covalent functionalization Using a Low-Energy Helium Carrier Plasma Plasma treatments were performed in a modified commercial plasma cleaner (Fischione 1070), equipped with a custom grid and mask holder, a custom gas-injection system, and a custom fibre-coupled sapphire viewport attached to a UV-vis spectrometer (Thorlabs). The thus modified apparatus was of the present invention, broadly as illustrated in FIG. 12(a).

The vacuum chamber was evacuated to <$10^{-5}$ Torr by a turbo pump. A carrier plasma of N6.0 grade helium was produced at 28 sccm flow rate and typical pressure $5 \times 10^{-1}$ Torr. The 18 MHz RF coil was operated at 40% power, yielding typically 9 W forward power and 0.6 W reverse power.

The vapors of the chemicals used for functionalizations were introduced through an evacuated five-channel manifold. The chemicals were stored in sealed, evacuated 1 mL stainless steel vials, and the vapor of the desired chemical was supplied through a precision micrometer needle valve and a shutoff valve into the plasma chamber. The effect of the introduced chemical was observed in the real-time spectrum of the plasma. Spectra were acquired with a 6 second exposure time, which saturated the helium lines and made the additional peaks from the precursors visible.

The most prominent feature in the optical spectra due to the introduction of organic molecules was the Hα peak at 656 nm (FIG. 12(d)). This is thought to be due to the high probability of breaking off terminal hydrogens from the molecule; whereas the separation of larger fragments or non-terminal moieties, like the atomic sulphur from a thiol, would require two or more bonds to be broken, and therefore is less likely.

The actual amount of chemical present in the plasma depends on the vapor pressure of each compound; this can be adjusted by controlling the temperature of the liquid container and the setting on the leak valve.

Once the desired plasma composition was established, a shutter covering the grid and mask holder was used to control the exposure time. Such a shutter and mask are illustrated in FIGS. 12(b) and (c). Between the uses of different chemicals, the chamber was cleaned using a pure He plasma at 70% power for 30-60 min, until no signs of trace hydrogen were visible in the optical spectrum.

These operations were completed using amylamine, hexanoic acid, 1-pentanethiol and 4-pentylphenol as functionalization chemicals. FIG. 12(e) shows XPS spectra of functionalized graphene showing chemical modifications.

(b) XPS of Functionalized Graphene

X-ray photoelectron spectroscopy (XPS) was used to study the covalent modifications to graphene as modified in accordance with (a) above. The beam from an Al Kα source (1486.68 eV, ESCALAB 250 Xi) was focused in a 900 μm diameter probe on the sample. Graphene on copper (as grown) and graphene transferred to UltrAuFoil gold grids (in accordance with Example 2) was used for these measurements, and charge compensation was applied. Partially hydrogenated and non-treated graphene specimens were used as controls to compare against functionalized graphene. The pressure in the XPS chamber during data acquisition was $5 \times 10^{-9}$ mBar.

First, spectral scans at 1 eV sampling were acquired in the 136 eV-1361 eV range with 200 eV pass energy, and then 30-50 scans with 30-50 eV pass energy at 0.1 eV sampling were acquired around the regions of interest and averaged to produce the spectra plotted in FIG. 12(e). The peaks were identified using data from the NIST XPS Database[27]. Some of the observed peaks were attributed to signal from the metal substrate supporting the graphene.

(c) Contact Angle Measurements

Contact angle measurements were performed on plasma treated graphene suspended on all-gold grids using a custom instrument[28]. Briefly, a 1-2 μL droplet of deionized 18 MΩ water was pipetted to the centre of the clamped grid, and imaged parallel to the surface against a background of diffuse illumination. Any images where the grid appeared bent or the droplet spread asymmetrically were discarded. The typical time between the end of the plasma treatment and the measurement was 1 min; for each data point 3-5 repeats were performed. The contact angle was quantified in ImageJ[29].

(d) Patterning of Functionalized Graphene

To pattern grids with multiple functional groups in different regions of each grid, a knife-edge mask was precisely positioned above the top surface of each grid for each plasma processing step ((a) above). This was done using a set of precision machined masks that fit in a defined position above a grid alignment holder. The apparatus was capable of patterning 2×10 grids at a time.

The sharpness of the pattern depends on and can be controlled by varying the following: the distance between the mask and the graphene surface, the sharpness of the mask edge, and the mean free path of the species in the plasma. Under the typical conditions used here (1 Torr, non-thermal remote plasma), the mean free path in the chamber is much larger than the other relevant length scales; it is therefore considered that the patterning resolution is approximately equal to twice the distance between the grid and the mask, i.e. 50 μm. This is confirmed by the width of the transition region in FIG. 1(a) for a knife-edge mask placed 20 μm above the surface of the foil.

(e) Amorphous Carbon Deposition Onto Graphene-on-Gold Supports

Amorphous carbon was deposited directly onto graphene-coated gold grids in an Edwards 306A evaporator evacuated to $10^{-6}$ mbar. The grids were positioned in a custom slotted holder, analogous to the one used for plasma treatments, and covered by a mask plate. Single-slot apertures with 100 μm hole diameter (EMS GA100-Au) were used for masks to only expose the center of the grid to the evaporated carbon. The grid-to-mask distance was approximately 100 μm. The successful localized deposition of a continuous amorphous carbon film was verified by TEM imaging (FIG. 3).

Figure 3:
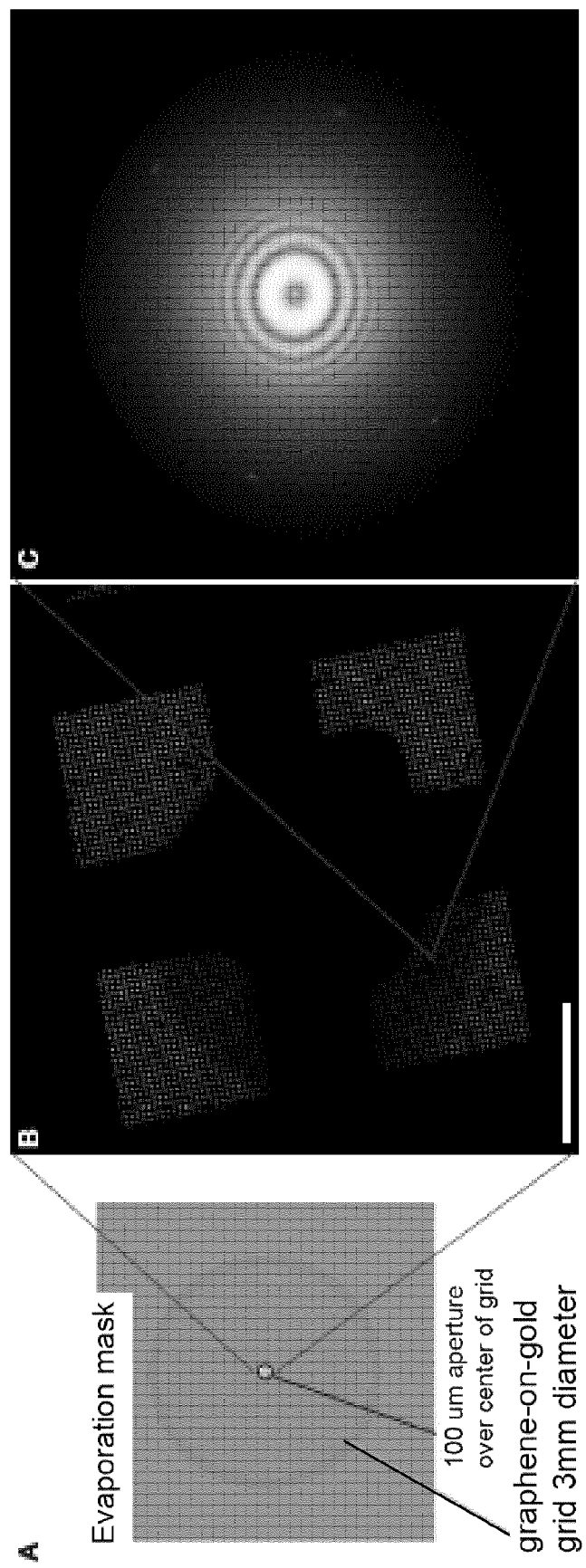
FIG. 3 shows TEM analysis of multifunctional graphene-on-gold support with an amorphous carbon-covered grid square for electron microscope alignments.

FIG. 3 illustrates a multifunctional graphene-on-gold support with an amorphous carbon-covered grid square for electron microscope alignments. FIG. 3(a) is a diagram of the aperture mask used during carbon evaporation to cover only ~1 grid square of the graphene-on-gold grid with a thin amorphous carbon film. The evaporation is done prior to any plasma treatments. FIG. 3(b) is a low-magnification transmission electron micrograph of the modified multifunctional grid, showing the asymmetric center mark and the darker region around it that was covered with ≈300 Å thick amorphous carbon film. The scale bar is 80 μm. FIG. 3(c) shows the Thon rings from the carbon-coated region (Fourier transform of transmission electron micrograph at 155, 000× nominal magnification, 0.4 μm defocus, with 700 Å intentional stigmation) can be used to correct astigmatism and coma. The graphene lattice reflections at 2.13 Å are still visible. Clean monolayer graphene in the areas protected by the mask, in contrast, does not give Thon rings.

This patterning method enables to directly evaporate amorphous carbon onto a 100 μm diameter region in the centre of the graphene-coated gold grid for stigmation and coma alignments on the same multifunctional grid prior to high-resolution data collection.

Example 2—Motion Tracking in Vitreous Ice Using Gold Nanoparticles (a) Grid preparation Specimens were prepared by manual plunge freezing at 4° C. All-gold-supports (UltrAuFoil R 0.6/1, 300-mesh, Quantifoil) with 800 nm hole diameter, with and without graphene were used. Specimen supports were plasma treated to render them sufficiently hydrophilic prior to the vitrification as follows: 60 s 9:1 $Ar:O_2$ plasma for the all-gold grids, 60 s hydrogen plasma for the graphene-coated grids. Then 3 μL of 10 nm unconjugated gold colloid solution at OD 100 (BBI Solutions) were applied to the foil side of the grids and blotted for 15 s from the same side before plunging into liquid ethane held at $93K^{30}$.

(b) Imaging

The data for the graphene-supported ice was collected on a Titan Krios, and for the unsupported ice—on a Tecnai Polara, using a Falcon 3 detector in integrating mode in both cases and imaging conditions, typical for single-particle data collection (300 keV, 1 e⁻/pix/frame, 80K specimen temperature). The illumination was centered over each exposed hole and the beam diameter was set to be slightly larger than the hole in order to minimize beam-induced motion[31]. The magnification was chosen so as to include the edges of the hole in the micrograph for drift tracking. This corresponded to 1.74 Å/pix on the Krios (47,000× nominal) and 1.72 Å/pix (59,000× nominal) on the Polara. Movies were acquired for a duration of 5-8 seconds to a cumulative fluence of 60 e⁻/Å². Only holes from squares without defects in the gold foil were imaged.

(c) Motion Analysis

The whole micrograph movies were motion corrected in MotionCorr[20] to remove stage drift. The motion corrected stacks were binned to give 1.5 e⁻/Å² fluence per frame. Particles were manually picked in EMAN2[21] and extracted from the motion corrected stack in 128×128 pixel frames. Each particle movie was then motion corrected again in MotionCorr. The corrected particle movies were visually inspected. The trajectories of all particles during the first 20 e⁻/Å² of irradiation were used to calculate the mean squared and root mean squared displacements of the particles over the ensemble.

Example 3—CryoEM of *T. thermophilus* 30S Ribosomal Subunit

Figure 5:
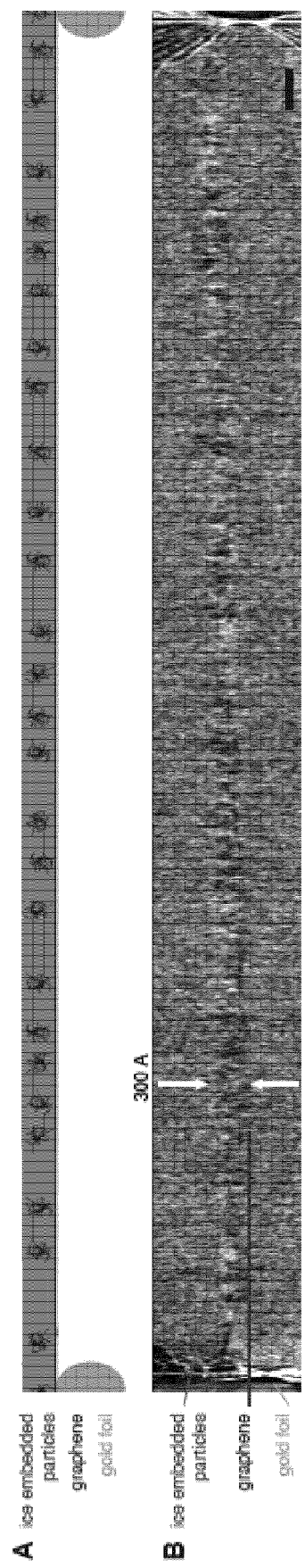
FIG. 5 is (a) a diagram of a specimen on a graphene-on-gold support; and (b) a vertical slice through a tomographic reconstruction of a functionalized graphene-covered hole with 30S ribosomes in vitreous ice. The ice thickness is 300±10 Å, just slightly larger than the size of the particles. All particles are located within one layer.
Figure 6:
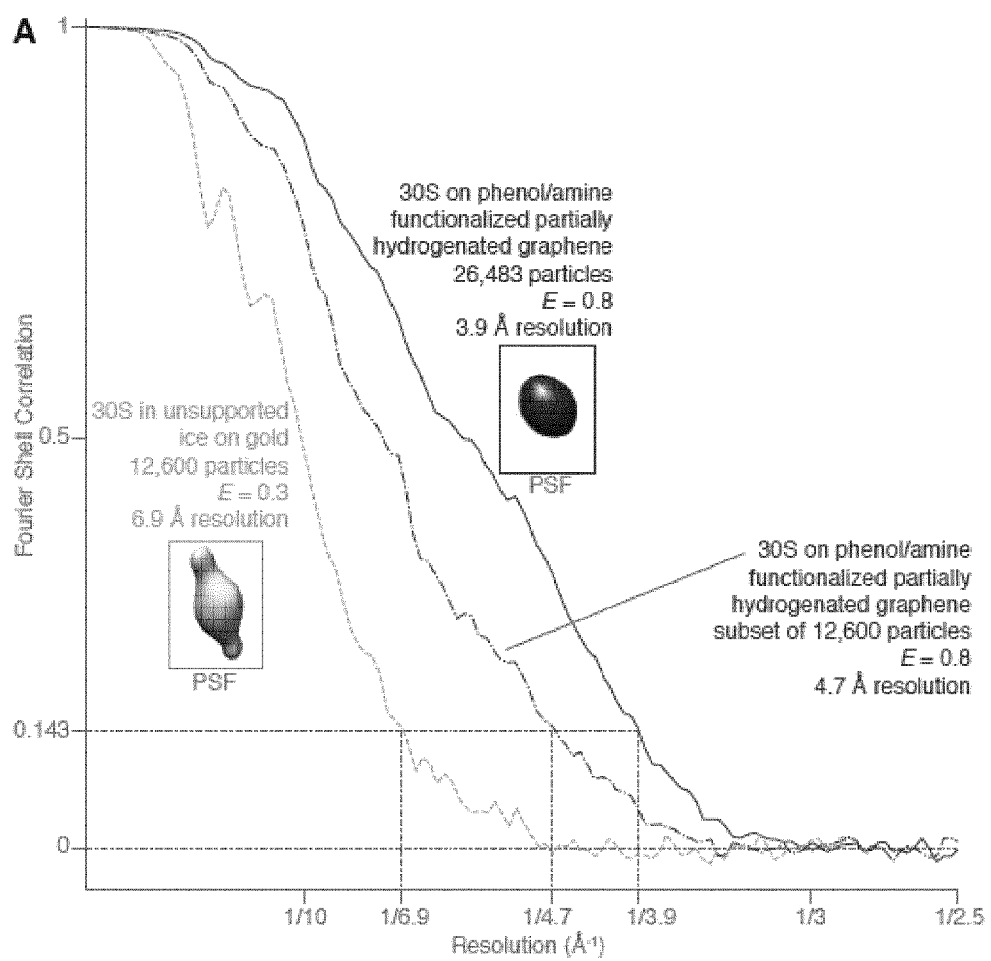
FIG. 6 shows data relating to efficiency and resolution improvement by optimizing the 30S ribosomal subunit orientation distribution on functionalized graphene.

This Example demonstrates the potential of multifunctional graphene supports for optimizing the specimen orientation distribution using the 30S ribosomal subunit as a test specimen[12, 13]. There were prepared graphene functionalized with amylamine, hexanoic acid, 1-pentanethiol and 4-pentylphenol by applying each of these chemicals to a half of a partially hydrogenated graphene coated gold grid. The orientation distribution of the 30S particles on each of these surfaces was analysed (FIGS. 13(a)-(b), FIGS. 4(a)-(d)). These distributions to those on partially hydrogenated graphene and in unsupported ice (FIGS. 4(e)-(f)). There was identified a combination of functionalized surfaces which increased the efficiency of the orientation distribution to $0.8^{14}$, enabling calculation of a high-resolution reconstruction of the 30S subunit alone (FIG. 6). The clear differences between all observed distributions indicate the particles are interacting with the functionalized graphene; this was verified by a tomographic reconstruction, showing that the particles are in a monolayer on the graphene surface in a layer of ice just thicker than the particle diameter[1] (FIG. 5).

(a) Grid Preparation

Purified *T. thermophilus* 30S ribosomal subunits (in 5 mM HEPES, 50 mM KCl, 10 mM $NH_4Cl$, 10 mM $Mg(OAc)_2$) were provided (by the Ramakrishnan lab at the MRC Laboratory of Molecular Biology; such specimens are also available commercially, for example from Sigma).

The concentration was adjusted to 8 mg/mL, except for the specimen on partially-hydrogenated graphene, where the concentration was 1.7 mg/mL. All graphene-coated grids used were first exposed to $H_2$ plasma for 180 s to render the whole surface hydrophilic, followed by a 30 s treatment of half of the grid with He plasma carrying the vapor of the corresponding functionalizing chemical (amylamine, hexanoic acid, 1-pentanethiol or 4-pentylphenol), and another 30 s treatment for the other half. Plain UltrAuFoil grids for the control experiment without graphene were treated with a 9:1 $Ar:O_2$ plasma mixture for 60 s. Grids were plunged using a FEI Vitrobot equilibrated at 4° C. and 100% relative humidity; the liquid ethane was kept at a fixed temperature of 93K. A 3-4 μL volume of the protein solution was pipetted onto the graphene-coated side of the grid, double-blotted for 5 s, and immediately plunged into the ethane. Typically less than 10 min elapsed between the plasma treatment and the vitrification. The grids were stored in liquid nitrogen until they were transferred into the electron microscope for imaging.

(b) Imaging and Data Collection

Micrographs of 30S ribosomes in ice on functionalized graphene were acquired on a Tecnai Polara microscope operated at 300 kV using a Falcon 3 detector in integrating mode. The nominal magnification was 93,000×, corresponding to 1.17 Å/pix (calibrated using the 2.13 Å graphene reflections). Micrographs of 30S ribosome in unsupported ice and in ice on partially-hydrogenated graphene were acquired on a Titan Krios microscope operated at 300 kV using a Falcon 3 detector in integrating mode, at nominal magnification 59,000×, corresponding to 1.34 Å/pix.

(c) Single Particle Data Analysis

Figure 2A:
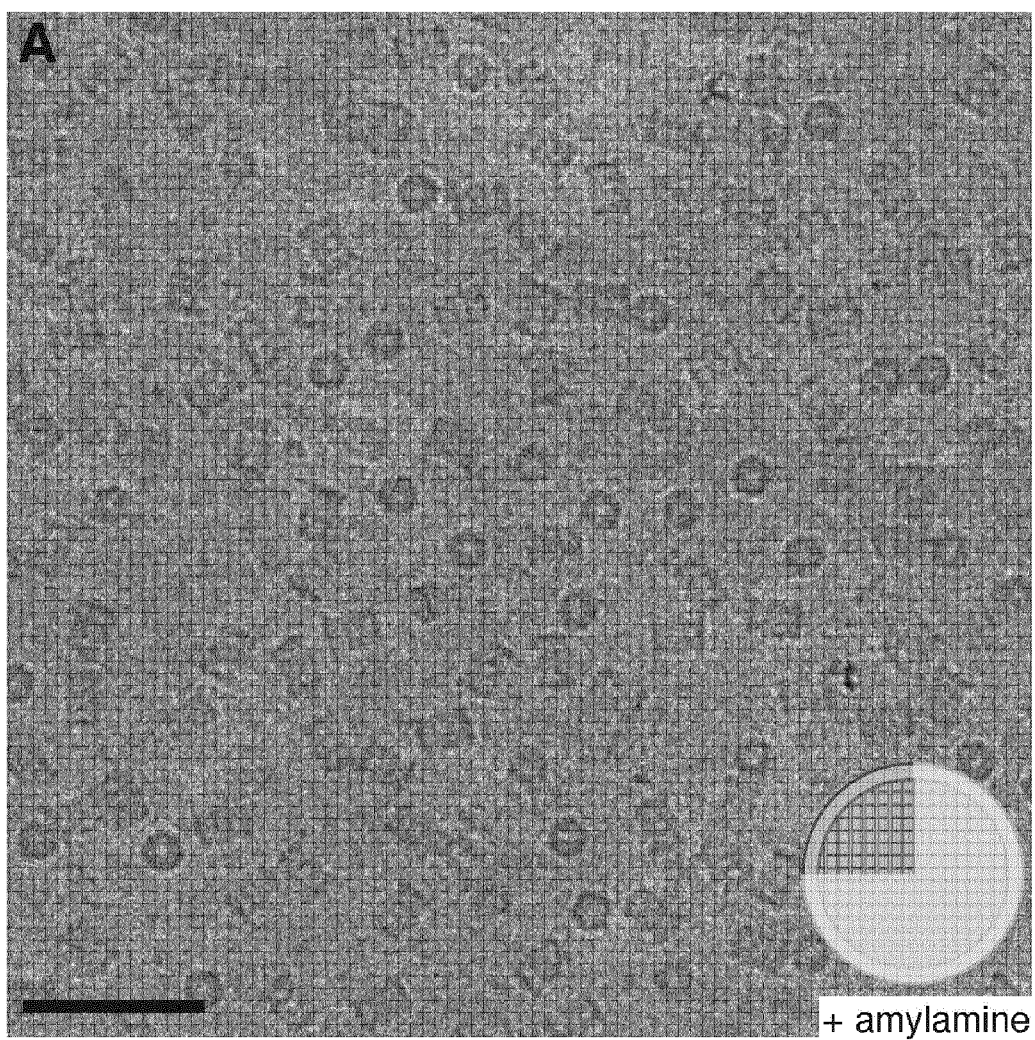
FIG. 2 shows experimental data relating to controlling the wettability of functionalized graphene and the orientation distribution of 20S proteasomes.
Figure 2B:
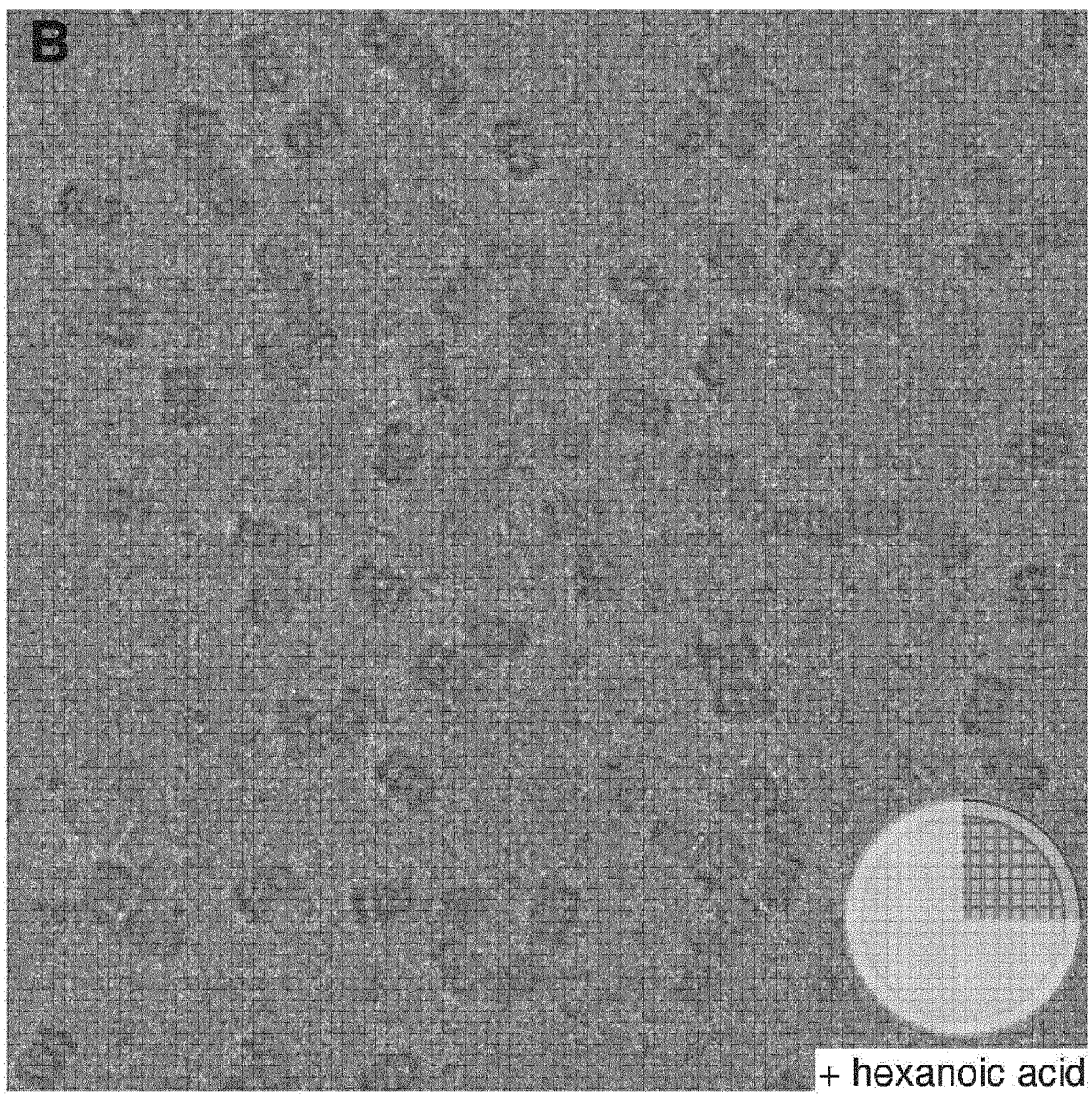
Figure 2C:
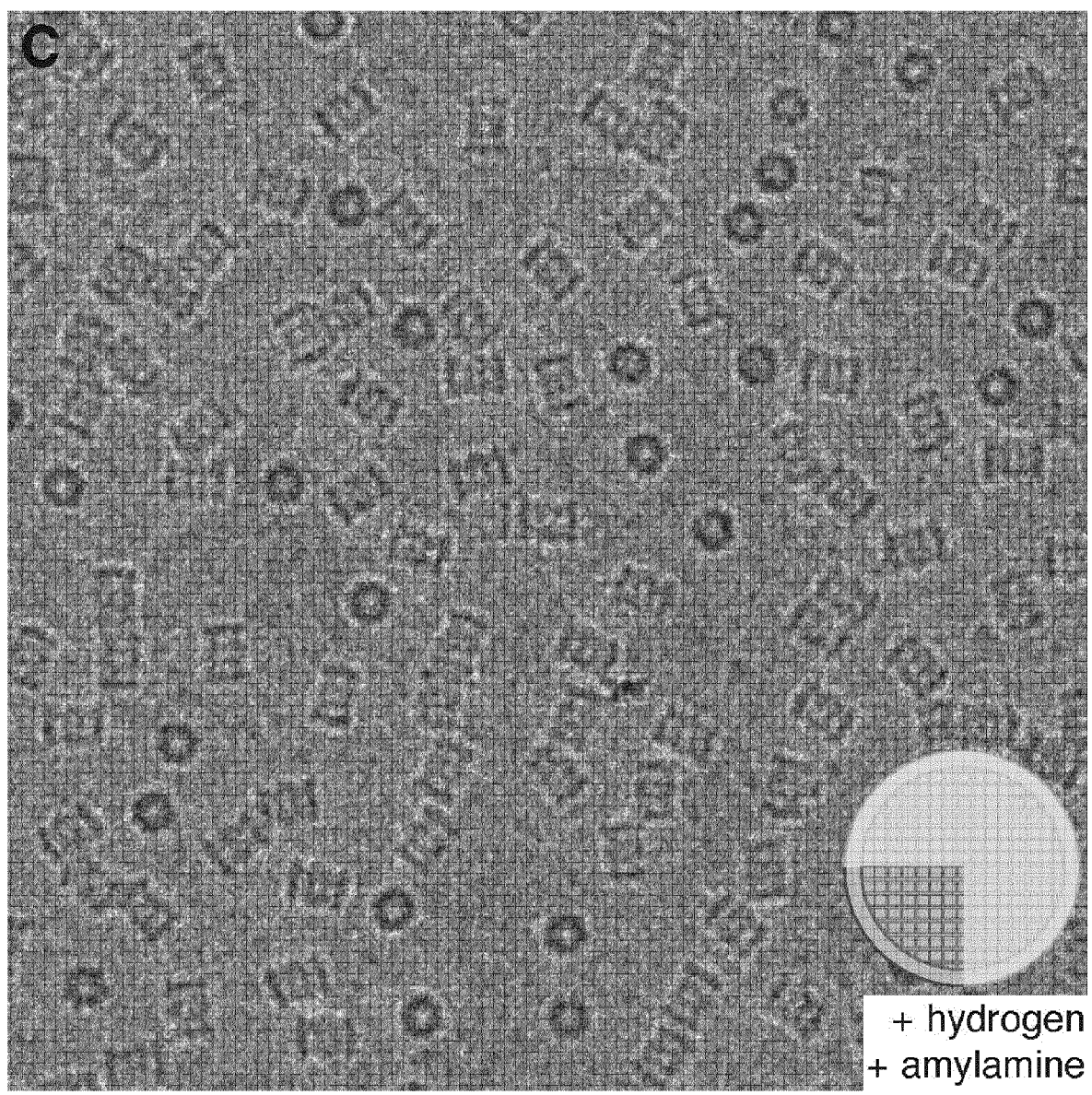
Figure 2D:
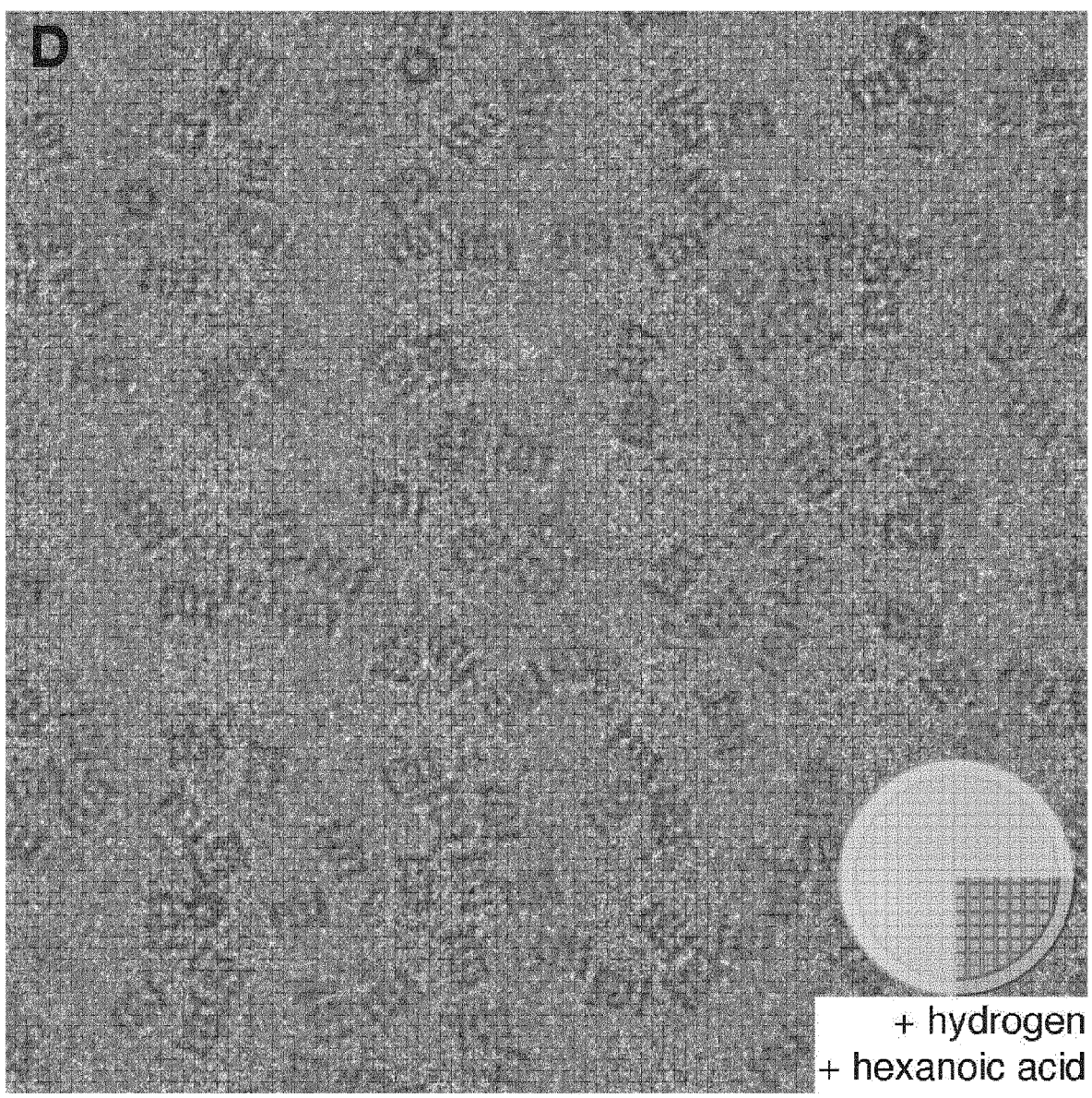
Figure 2E:
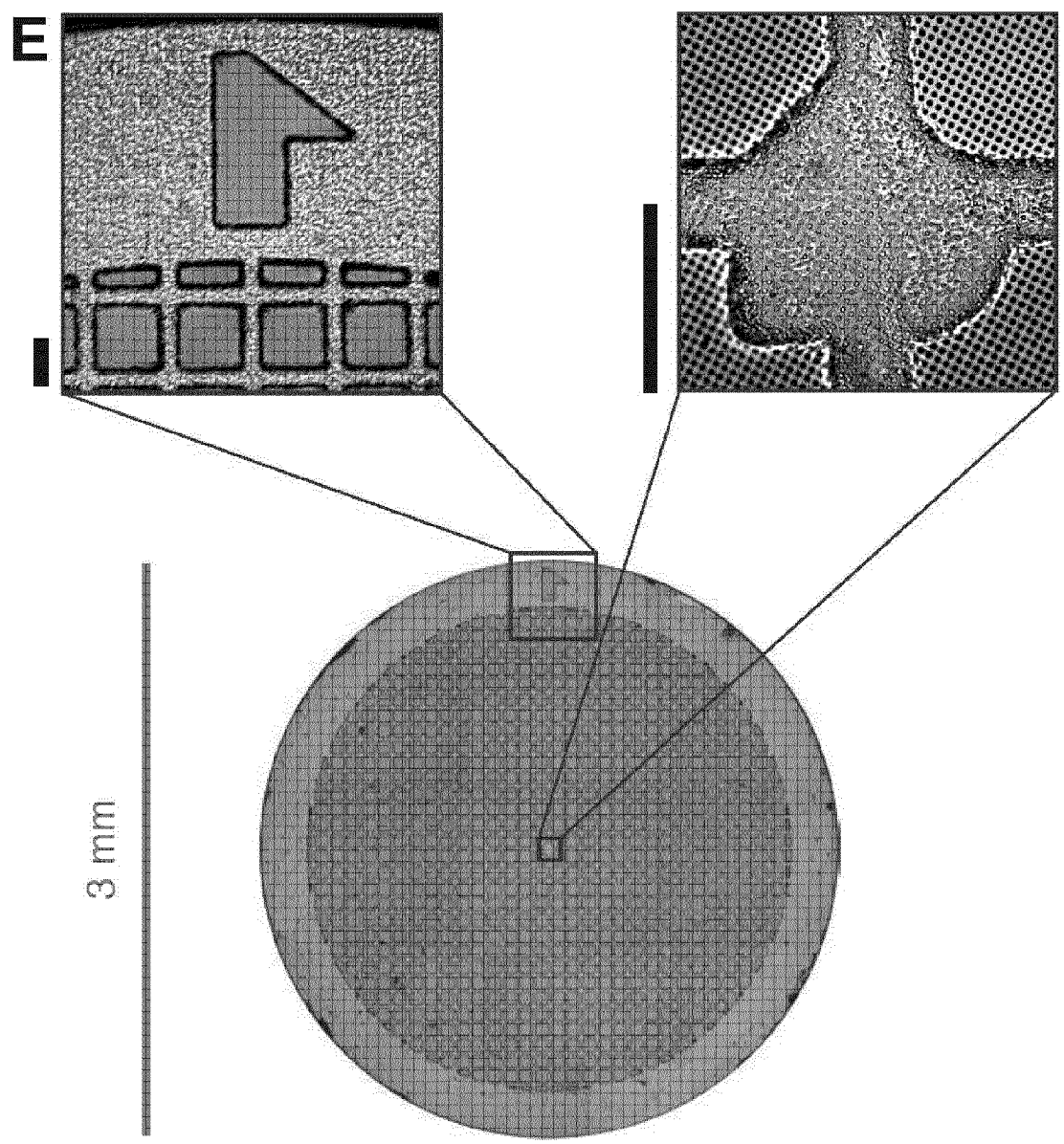

The sectors of the functionalized grids were identified using the asymmetric center mark (see FIG. 2(e)). The micrographs were motion corrected in Relion 3[17], CTFs were fit using Gctf[22], particles were manually picked in EMAN2, 2D classification and 3D refinement were done in Relion 3. All particles from the functionalized grids were processed together and the final orientation angles were sorted into categories for each surface based on the micrograph name and the corresponding coordinate on the grid. The particles from the control experiments were processed separately due to differing pixel sizes. The orientation distributions of the particles were analyzed using cryoEF[14] and plotted on an equal-area Mollweide projection, with the shaded scale representing the local gaussian kernel density (i.e. probability distribution function, PDF) of the distribution at every sampled orientation (see FIGS. 13(a)-(b), FIG. 6). The bandwidth for the kernel density was set to 5°. These plots also represent the normalized probability of the particle interacting with the surface in a particular orientation, thereby quantifying the strength of this interaction. Some spread in the assigned orientations might be due to local bending of the foil, wrinkling of the graphene, bulging of the ice, or bending of the exible parts of the ribosomal subunit, all of which are likely <5°. The high-resolution crystal structure of the 30S ribosome (1J5E[12]) was converted to a surface and shaded by surface Coulombic potential as calculated in UCSF Chimera[23] to illustrate the dominant orientations of the particle on the graphene and analyze the interaction interfaces (see FIGS. 13(c)-(f)). The potential of each orientation distribution to provide uniform Fourier space sampling for enabling high-resolution reconstruction was assessed using the efficiency metric[14]. The efficiencies were calculated for each separate orientation distribution from approximately 10 thousand particles; these can then be used to make a rational decision regarding the most optimal surface or combination of surfaces for further data collection.

In this example, the surfaces of choice would be amine- and phenol-functionalized graphene, providing a combined efficiency of 0.8, thereby enabling near-atomic structure determination with approximately 100 times less particles than, for example, from a dataset of unsupported 30S ribosomes in ice with an efficiency of 0.3[14] (see FIG. 6).

In FIG. 6, there is shown the efficiency and resolution improvement by optimizing the 30S ribosomal subunit orientation distribution on functionalized graphene. Shown are gold-standard FSC plots for the reconstruction of the 30S in unsupported ice (dashed line), yielding 6.9 Å resolution from 12,600 particles, and the 30S on amine/phenol functionalized graphene (solid line), yielding 3.94 Å resolution from 26,483 particles.

The combination of these functionalizations was predicted to maximize the efficiency of the orientation distribution. The difference in resolution is not due to the two-fold difference in particle number, as demonstrated by the reconstruction from a subset of 12,600 particles from the high-efficiency dataset (dash-dotted line), which reached 4.68 Å. The insets show the corresponding point spread function (PSF) for each orientation distribution; the PSF is elongated in the weakest resolved direction.

(d) Tomography

Single-axis bidirectional tilt series spanning the −50° to +50° range in 5° increment were collected for the same specimen on a Titan Krios operated at 300 keV using a Falcon 3 direct electron detector in integrating mode. The exposure in each image was 2 e$^-$/Å$^2$ over 1 s (40 frames) at 37,000× nominal magnification. The movies were motion corrected in MotionCorr[20], the tomogram was aligned without fiducials and reconstructed using SIRT in Etomo (IMOD)[24].

(e) Discussion

These experiments reveal a functional interaction map of the surface of the 30S ribosomal subunit. This allows us to create a physical model of the particle-surface interaction which accounts for the observed orientation distributions. On the carboxylated support, the dominant view indicates that the protein-rich exterior side of the 30S faces the surface (FIG. 13(d)). Several positively charged amino acid residues, including Arg S2[226], Lys S10[80], Lys 84[166, 169], are exposed on this side and likely stabilize contact with the surface. The same orientation is more favoured on the thiol-functionalized surface (FIG. 4(b)), consistent with the low pKa of a thiol group. The next most frequent orientation on the carboxylated graphene is with the 50S side of the 30S subunit facing the surface (FIG. 13(c)). The interactions that cause this orientation are likely similar to the ones occurring at the 30S-50S interface in vivo. The putative anchor points include the Arg/Lys rich S13 chain near the head of the 30S and the 16S rRNA 5' domain at the surface of the body. This orientation is strongly favoured on partially-hydrogenated graphene (FIG. 4(e)). In contrast, it is underrepresented on amylamine-treated partially hydrogenated graphene which is consistent with the high pKa of an amine group. Of all surfaces tested here, the amylamine/hydrogen-functionalized graphene minimized orientation bias for the specimens tested. Still, some acidic amino acid residues (Glu S6[24, 31], Glu S13[58]) can be identified as putative interaction points of the 30S subunit contacting the amine-graphene surface (FIG. 13(e)-(f)). The Debye screening length in the buffer used is ~10 Å, therefore we only consider electrostatic interactions with amino acid side chains that come to closer contact with the graphene surface. The spread of views around each preferred direction is determined by the shape of the particle and how it limits rotation around the fixed interaction point.

Figure 13:
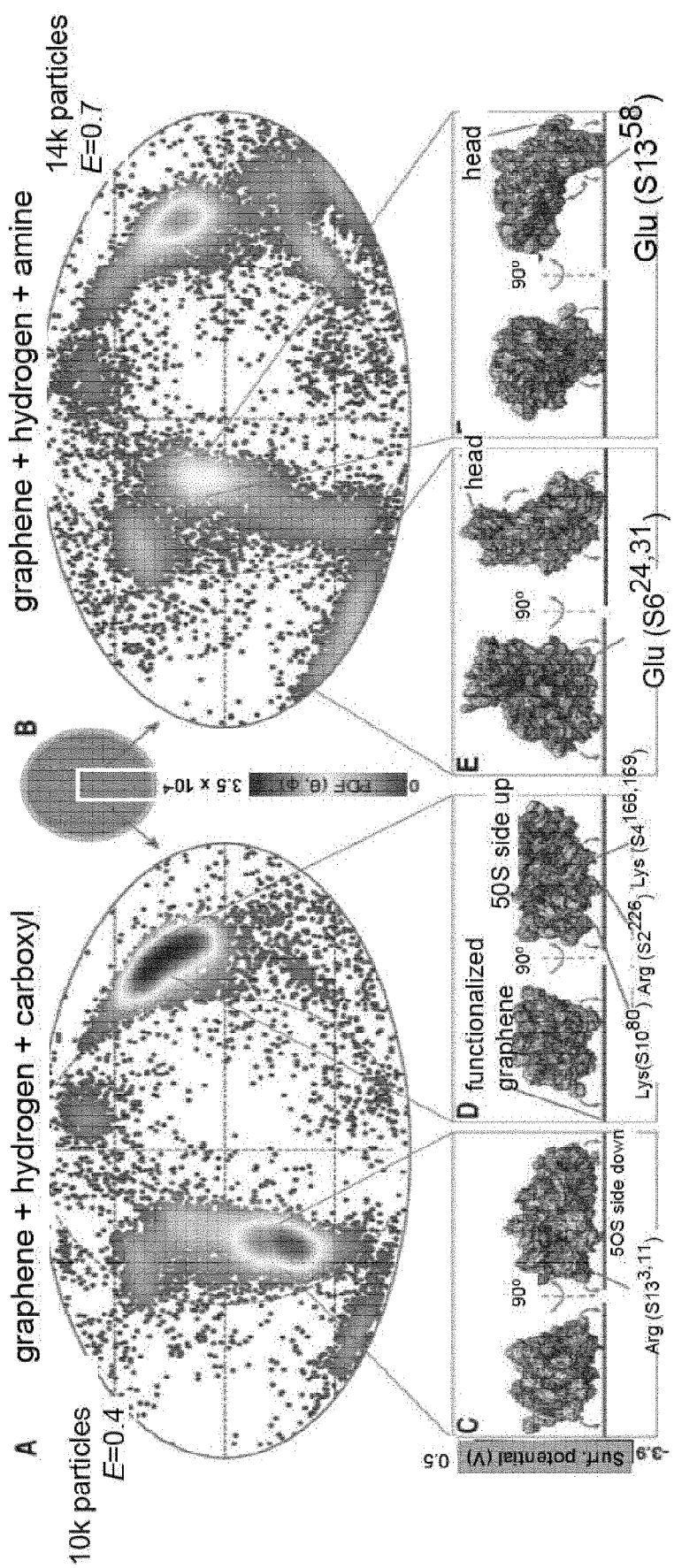
FIG. 13 shows (a)-(b) the orientation distributions of 30S ribosomal subunits on two different graphene functionalizations from a single patterned grid plotted on a Mollweide projection; and (c)-(f) the surface of the 30S ribosomal subunit shaded by Coulombic electrostatic potential.

NB In FIG. 13(a)-(b) the orientation distributions of 30S ribosomal subunits on two different graphene functionalizations ((a) graphene+hydrogen+carboxyl, that is, partially hydrogenated graphene with a carboxyl functionalization derived from hexanoic acid and (b) graphene+hydrogen+amine, that is, partially hydrogenated graphene with an amine functionalization derived from amylamine) from a single patterned grid are plotted on a Mollweide projection. Each point represents an observed particle and the scale represents the calculated normalized probability density of observing a particle in a particular orientation. E is the efficiency of each orientation distribution[14]. The directions of the two most probable views and the variations around these are labelled.

Figure 4:
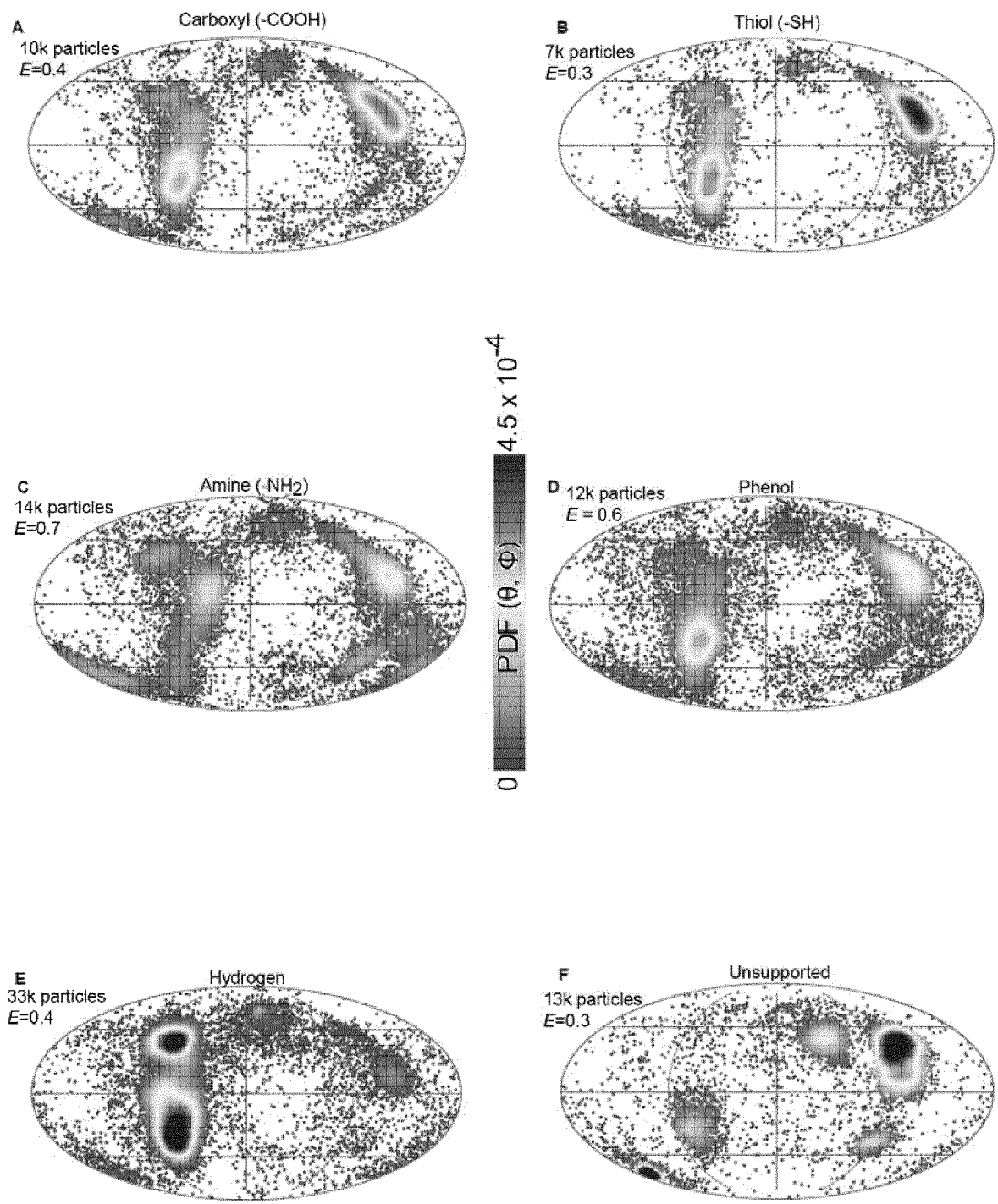
FIG. 4 shows Mollweide projection orientation distribution plots of 30S ribosomes on graphene functionalized with hexanoic acid (FIG. 4(a)), 1-pentanethiol (FIG. 4(b)), amylamine (FIG. 4(c)), 4-pentylphenol (FIG. 4(d)), all carried by a helium plasma and preceded by partial hydrogenation, on partially hydrogenated graphene (FIG. 4(e)), and unsupported in ice (FIG. 4(f)).

FIG. 4 shows, more completely, Mollweide projection orientation distribution plots of 30S ribosomes on graphene functionalized with functionalizations derived from (a) hexanoic acid, (b) 1-pentanethiol, (c) amylamine, (d) 4-pentylphenol, all carried by a helium plasma and preceded by partial hydrogenation; on (e) partially hydrogenated graphene; and (f) unsupported in ice. Each point represents an observed particle orientation on the graphene surface and the scale represents the calculated normalized probability distribution function (PDF) of observing a particle in a view given by the Euler angles ($\phi$, $\theta$). All plots are displayed on the same scale with the peaks corresponding to the dominant views in (e)-(f) saturated. The efficiency E of each orientation distribution is shown.

Example 4—CryoEM of Human 20S Proteasome (a) Grid Preparation

A specimen of human 20S proteasome (Enzo) was buffer-exchanged into TBE (89 mM Tris, 89 mM boric acid, and 2 mM EDTA) at pH 8.3 and adjusted to 0.8 mg/mL concentration. Four-quadrant grids were prepared by exposing one half of the grid to 180 s hydrogen plasma, then rotating the mask by 90°, exposing a half of the grid to amylamine under helium plasma for 30 s, and rotating the mask by 180° to expose the other half of the grid to hexanoic acid under helium plasma for 30 s. Vitrification was done in the same way as above.

(b) Imaging and Data Collection

Micrographs were acquired on a Titan Krios microscope operated at 300 kV using a Falcon 3 detector in integrating mode. The flux was set to 17 $e^-/Å^2/s$ and the exposure time was 2 s; a 70 µm objective aperture was used. The nominal magnification was 59,000×, corresponding to 1.34 Å/pix, calibrated using the reflections from anatase ($TiO_2$) nanoparticles dispersed on a separate calibration grid. The quadrants of the grids were identified with respect to the orientation of the asymmetric grid center mark as above (see FIG. 2).

FIG. 2 illustrates experimental efforts for controlling the wettability of functionalized graphene and the orientation distribution of 20S proteasomes. FIGS. 2(a)-(d) show representative micrographs of 20S proteasomes on graphene in ice taken from the four quadrants of a single patterned multifunctional graphene grid. The quadrant of the grid from which the micrograph was collected is highlighted in each inset. The hexanoic acid treatment (FIG. 2(b)) renders the grid hydrophobic which is manifested in the poor wetting of the graphene surface and the protein being partially dried out. This can be rescued by pre-treating the grid with hydrogen plasma (FIG. 2(b)) to make the surface hydrophilic and allow the formation of a uniform thin ice layer independent of the subsequent functionalization. It is thus demonstrated that an initial hydrogen plasma treatment allows for subsequent functionalization of the graphene surface with potentially hydrophobic compounds while preserving the macroscopic surface wetting necessary for the formation of a thin ice layer.

Figure 2F:
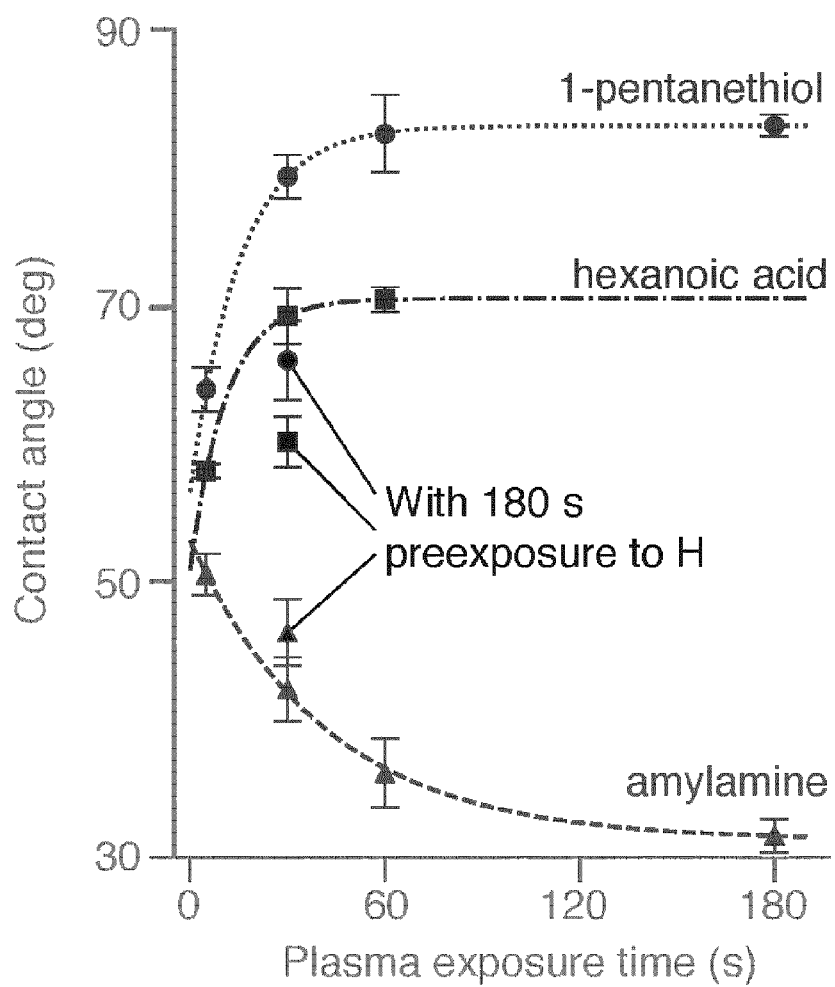

The axes dividing the grid into four differently functionalized quadrants were defined by orienting the grid rim mark (FIG. 2(e), inset), which can be easily seen by eye, parallel or perpendicular to the mask edge. The quadrants were identified by finding the location and the orientation of the asymmetric grid centre mark (FIG. 2(e), inset) in low-magnification mode in the TEM. The insets in FIG. 2(e) show optical micrographs of the rim mark and the centre mark in their true relative orientation. The scale bars are 500 Å for FIGS. 2(a)-(d) and 50 µm for the insets in FIG. 2(e). As shown in FIG. 2(f), contact angle measurements on functionalized graphene can be used to monitor the extent of surface modification and to assess the hydrophilicity of the resulting surface.

Based on previous experiments with partial hydrogenation, it can be estimated that ~1 functional group per $nm^2$ is added to the graphene as a result of a typical exposure. Functionalization with carboxyls and thiols tends to render the surface hydrophobic, as indicated by the higher contact angle, which is potentially problematic for freezing specimens for cryoEM. This can be avoided by a pre-treatment with 180 s of hydrogen plasma before the typical 30 s exposure to the functionalizing chemical (darkened data points).

This method of first partially hydrogenating the graphene before functionalization reliably produced surfaces with sufficient wetting for preparing cryo specimens.

Example 5—CryoEM of Apoferritin

In this Example, to demonstrate that the present supports are suitable for high-resolution structure determination, an amylamine-functionalized graphene on gold support is used to determine the structure of horse spleen apoferritin.

(a) Grid Preparation

Horse (*Equus caballus*) spleen apoferritin (Sigma) was buffer-exchanged into 100 nM phosphate-buffered saline at pH 7.4 and adjusted to 11.7 mg/mL concentration. Graphene-coated grids treated with He plasma carrying amylamine for 30 s were used. Vitrification was done in the same way as above.

(b) Imaging and Data Collection

Movies were acquired on a Titan Krios microscope operated at 300 kV using a Falcon 3 detector in counting mode. The nominal magnification was 120,000×, with pixel size 0.6495 Å/pix, calibrated using the 2.347 Å Au reflections in the Fourier transform of a micrograph of the gold substrate foil taken under the same conditions as used for data collection. A 100 µm objective aperture was used during data collection. Movies were acquired with 30.01 s exposure time, and the frames were grouped into 38 fractions (31 frames per fraction). The flux was set to 0.53 $e^-$/pix/s, corresponding to a total fluence of 37 $e^-/Å^2$ in each movie.

Figure 7:
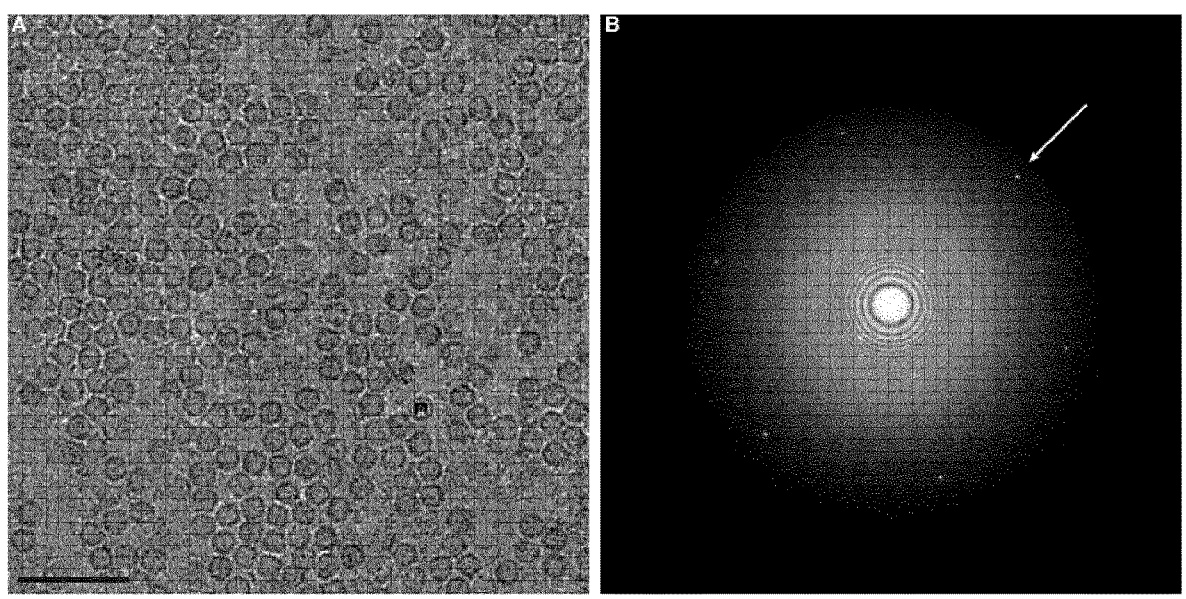
FIG. 7 is a high-resolution structure determination of apoferritin on graphene-on-gold support.

FIG. 7(a) shows a micrograph of the apoferritin particles in vitreous ice on amylamine-functionalized graphene. The graphene lattice is directly visible from such electron micrographs at suitably high-magnification.

(c) Single Particle Data Analysis and Modeling

The micrographs were motion corrected in Relion 3, CTFs were fit using Gctf, particles were manually picked in EMAN2, 2D and 3D classification, 3D refinement, CTF refinement, particle polishing and post-processing were all done in Relion 3. The resulting EM density map reached 2.14 Å gold-standard FSC resolution and was in agreement with the corresponding high-resolution crystal structure (2W0O[25]):

TABLE 2

| Data Collection Statistics for Apoferritin | |
|---|---|
| Number of micrographs | 479 |
| Number of particles | 41 202 |
| Number of asymmetric units | 988 848 |
| Pixel size | 0.6495 Å |
| Defocus range | 0.4-2.0 µm |
| Mean defocus | 1.1 µm |
| Electron flux | 1.23 $e^-/Å^2/s$ |
| Electron fluence per frame | 0.97 $e^-/Å^2$ |
| Specimen temperature | ≈80 K |
| Particle box size | $(340\ px)^2$ |

Illustrations of the 3D map with the fitted model were rendered in Chimera. The orientation distribution of the particles contributing to the final reconstruction was analyzed using cryoEF and showed an efficiency of 0.7. For the motion analysis, the displacement of each particle throughout the movie was calculated by subtracting the whole-micrograph movement from the particle movement as calculated by Bayesian polishing in Relion[26]. This was necessary since the dominant component of the motion was drift of the microscope stage at a rate of 0.6 Å/s throughout the 30 s exposure.

(d) Discussion

Figure 14:
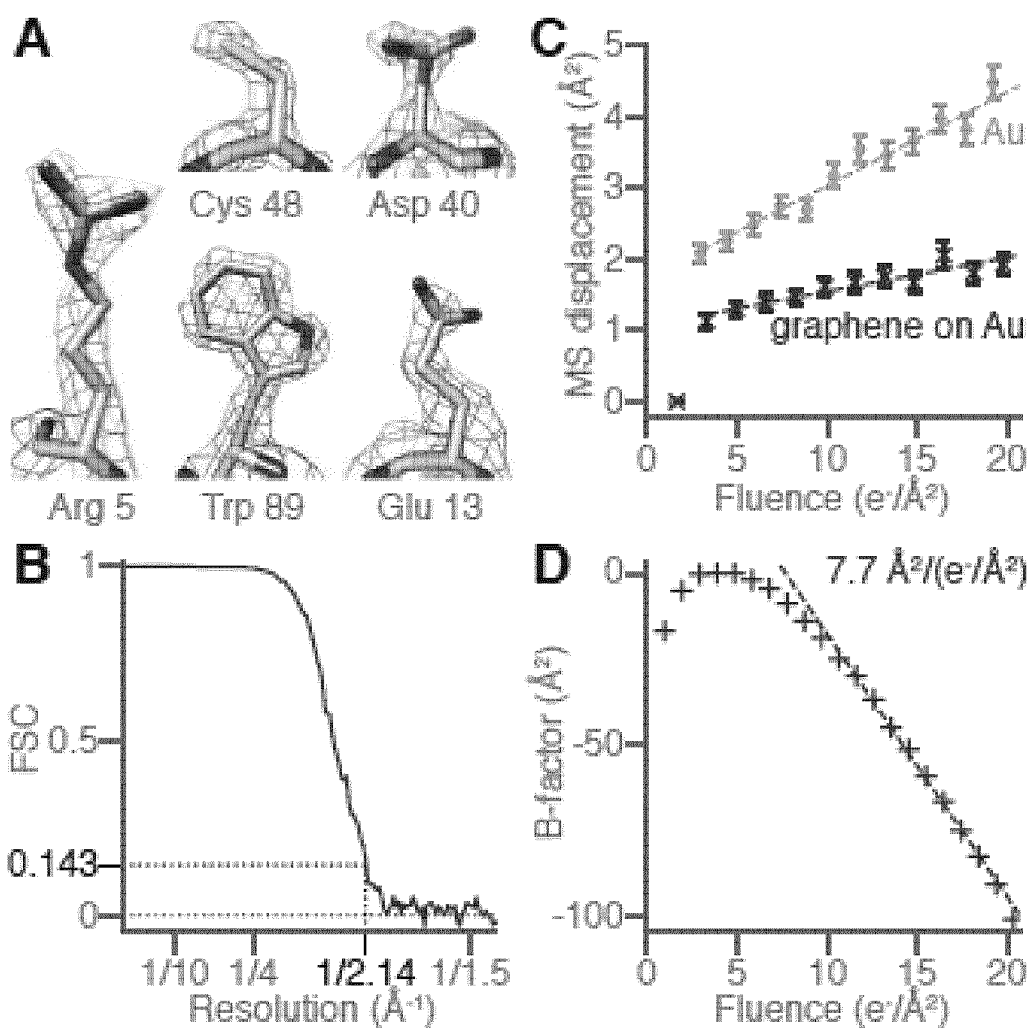
FIG. 14 includes (a) contoured density maps of apoferritin, showing amino acid side chains within the structure; (b) a Fourier shell correlation plot (FSC) for the apoferritin structure; (c) mean squared displacement of gold nanoparticles unsupported in ice (paler circles) or in ice on graphene (darker crosses), on all-gold supports; (d) calculated B-factors as a function of electron fluence for the apoferritin dataset.

FIG. 14 shows more information on the high-resolution structure determination using multifunctional graphene-ongold supports. FIG. 14(a) shows contoured density maps of apoferritin, showing amino acid side chains within the structure. FIG. 14(b) shows a Fourier shell correlation plot (FSC) for the apoferritin structure. FIG. 14(c) shows mean squared displacement of gold nanoparticles unsupported in ice (paler circles) or in ice on graphene (darker crosses), on all-gold supports. The addition of the graphene film reduces both the movement at the beginning of irradiation and the diffusion-like movement during the later frames by 2×. The dashed lines are linear fits to the data excluding the first frame. The slope decreases from $0.13\pm0.1$ $Å^2/(e^-/Å^2)$ to $0.048\pm0.005$ $Å^2/(e^-/Å^2)$ with the addition of the graphene to the all-gold specimen support. FIG. 14(d) shows calculated B-factors as a function of electron fluence for the apoferritin dataset. The B-factor in the first 3 $e^-/Å^2$ corresponds to the initial non-diffusional movement phase. The B-factor decreases at an approximately constant rate of $7.7\pm0.8$ $Å^2/(e^-/Å^2)$ with fluence in the range 10-20 $e^-/Å^2$ (dashed line shows linear fit).

Figure 8:
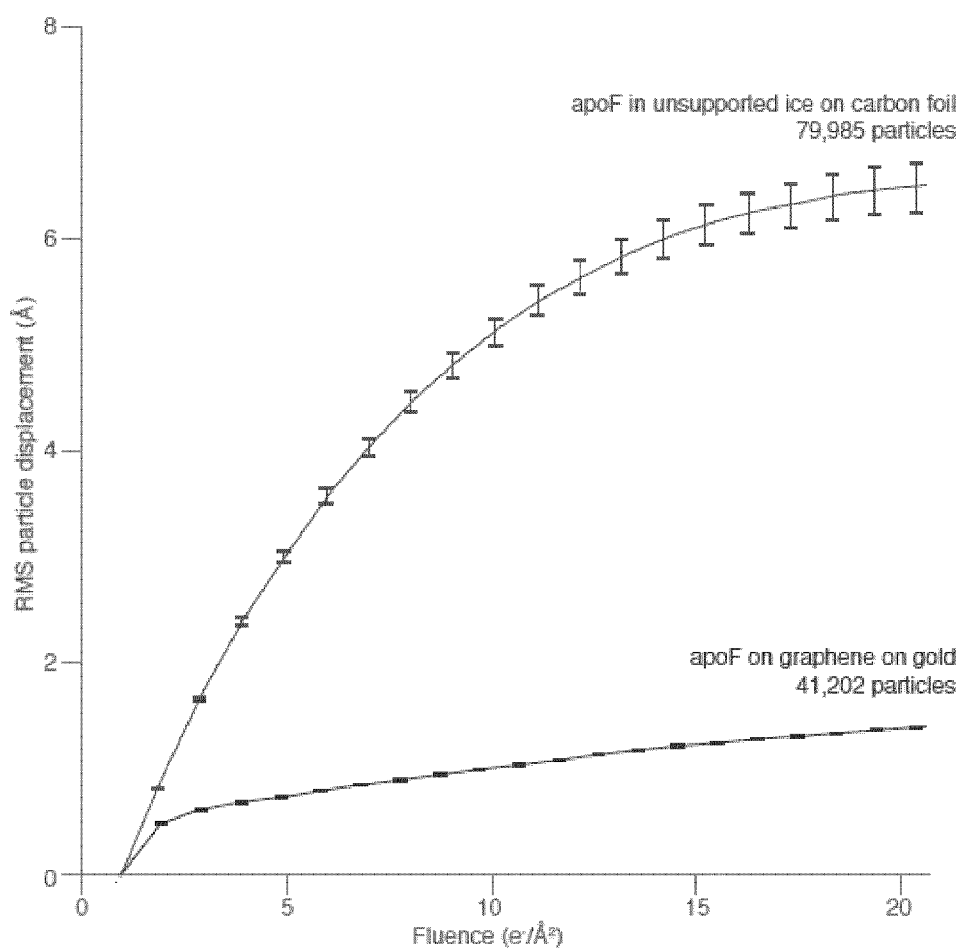
FIG. 8 shows the root-mean-squared (RMS) displacement during irradiation for apoferritin particles in unsupported ice on a carbon grid, and on graphene-on-gold.
Figure 9:
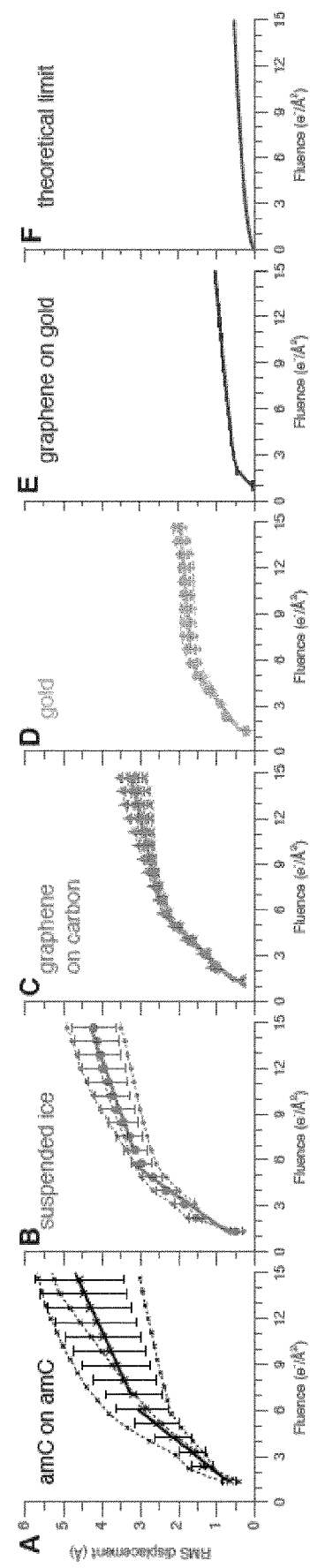
FIG. 9 illustrates the reduction of the movement of biological specimens on graphene-coated all-gold grids. Root mean squared (RMS) displacement of ribosomes with MW 2 MDa is plotted versus electron fluence.

The reconstruction reached 2.1 Å resolution (0.143 $FSC^{16}$) from 41,202 particles with standard data collection and processing (see Table 2, FIG. 7, FIG. 14)). The resolution of the reconstructed map, which is equivalent to the highest reported to date for this specimen[17], but required about half as much data, is demonstrated by clear densities for side chains in the map (FIG. 14(a)). This includes complete aspartate and glutamate residues, for which densities beyond the CR are often absent from EM maps's. The decay rate of high-resolution information with fluence after the first 5-10 $e^-/Å^2$ of irradiation in this dataset (FIG. 14(d)) is similar to measurements of radiation damage in 2D protein crystals[19]. We compare the movement of particles on multifunctional graphene-on-gold supports to previous measurements on several other supports[4] (FIG. 8, FIG. 9)). FIG. 8 shows root-mean-squared (RMS) displacement during irradiation for apoferritin particles in unsupported ice on a carbon grid (upper), and on graphene-on-gold (lower). The particles in unsupported ice are from the dataset corresponding to the previously highest-resolution published structure of the commercially available horse spleen apoferritin[17]. Error bars are standard error in the mean. The functionalized graphene-on-gold support reduces initial movement, the rate of displacement, and the variance in particle motion during irradiation in comparison to holey amorphous carbon supports. FIG. 9 shows root mean squared (RMS) displacement of ribosomes with MW 2 MDa is plotted versus electron fluence. FIG. 9(a)-d) and (f) are reproductions of previously described work[4]. The motion on graphene-on-gold supports, FIG. 9(e), was originally measured from the apoferritin dataset obtained herein, and the effective diffusion constant was scaled by its molecular weight ($MW^{1/3}$) for this comparison, according to the Stokes-Einstein equation[9]. The motion of the specimen on a graphene-on-gold support is diffusion-like (with the mean squared displacement directly proportional to the fluence) except at the very beginning of irradiation.

Figure 10:
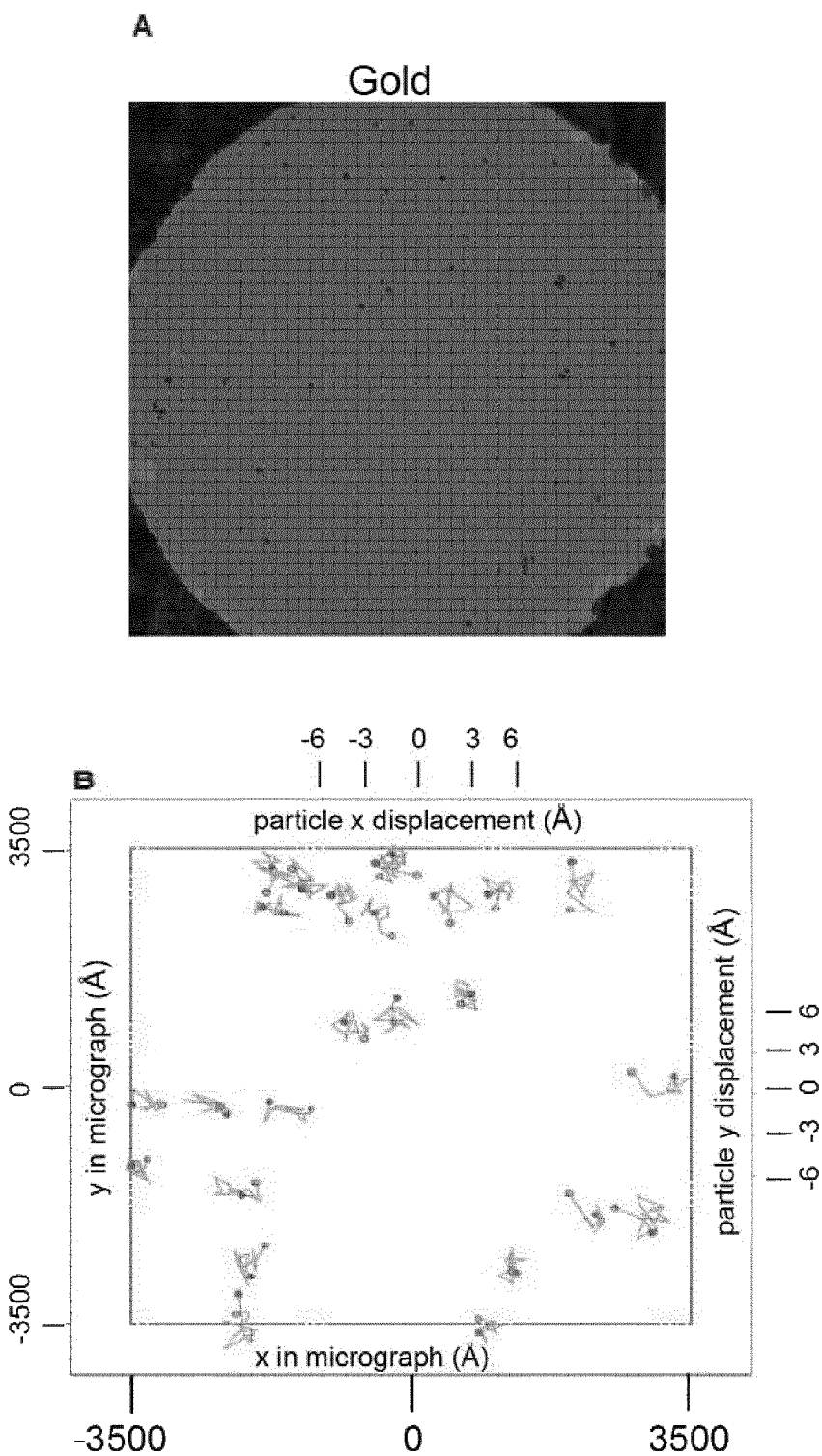
FIG. 10 shows the reduction of the movement of nanoparticles on graphene-coated all-gold grids.
Figure 10:
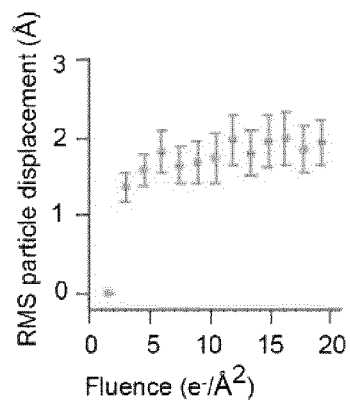
Figure 10:
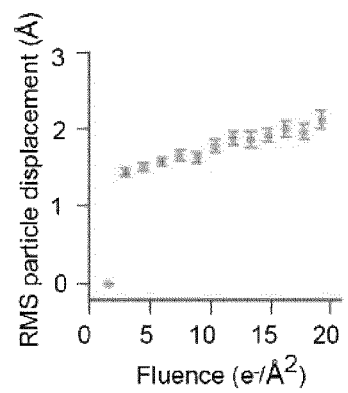
Figure 10:
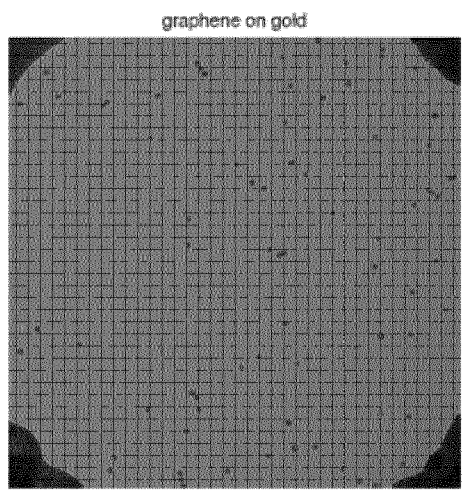
Figure 10:
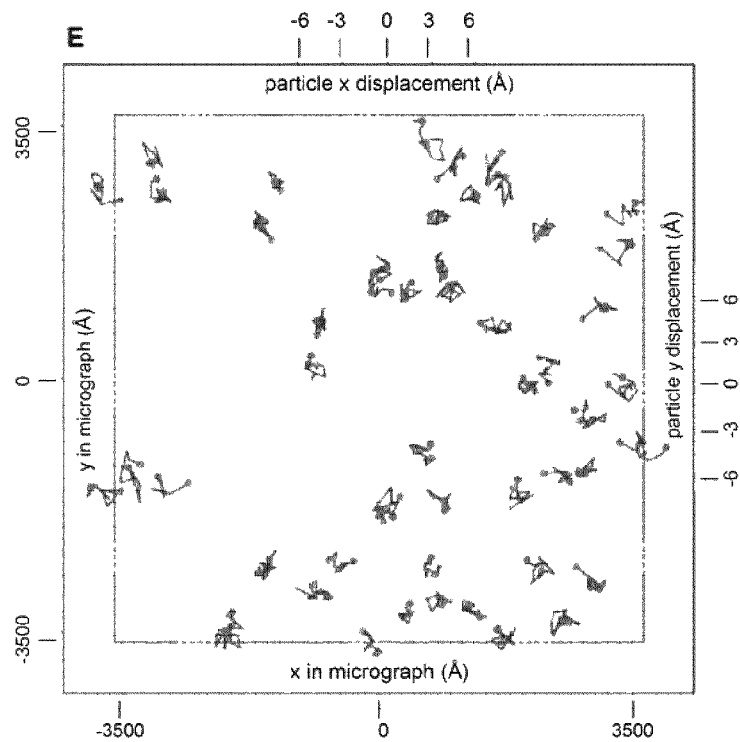
Figure 10:
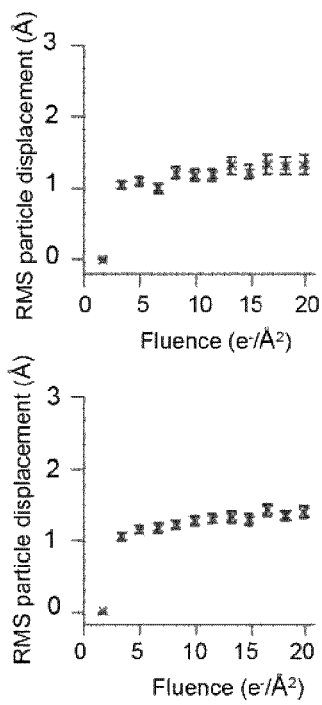

Adding a graphene layer to an all-gold support reduced particle movement by a factor of two during electron irradiation. Compared to graphene-on-carbon supports, graphene-on-gold supports reduced particle movement by a factor of three. The reduction in particle motion was also verified by tracking the movement of individual gold nanoparticles on an all-gold support with and without an additional graphene layer (FIG. 14(c), FIG. 10)). FIG. 10 shows reduction of the movement of nanoparticles on graphene-coated all-gold grids. Gold nanoparticles (10 nm in diameter, 6 MDa in mass) were imaged in unsupported vitreous ice on all-gold grids (FIG. 10(a)) and in vitreous ice on graphene on all-gold grids (FIG. 10(d)) at such a magnification so as to include the edges of the hole in the field of view for drift tracking. The trajectories of the particles on the motion-corrected whole micrograph are plotted magnified by 200× (FIG. 10(b) and FIG. 10(e)). The dashed square corresponds to the area of the micrograph, the empty circles are the initial particle positions and the filled circles are the final particle positions after 20 $e^-/Å^2$ total fluence. In FIG. 10(c) and FIG. 10(f), the root mean squared (RMS) displacement of the gold nanoparticles is plotted versus electron fluence for the shown micrograph (upper panel) and for an average of n=19 micrographs (gold) and n=8 micrographs (graphene-on-gold) of the same kind (lower panel).

Importantly, besides reducing the rate of random particle motion, the addition of the graphene layer also reduces the movement during the first few electrons of irradiation, improving the quality (B-factor) of these initial frames (FIG. 14(c)-(d)), in which the molecules are less damaged by the beam. This two-fold reduction may be due to the graphene layer restricting the bulk movement of the thin film of ice within each hole, which occurs as stress is released at the initiation of irradiation with the electron beam.

REFERENCES

A number of publications are cited above in order to more fully describe and disclose the invention and the state of the art to which the invention pertains. Full citations for these references are provided below. The entirety of each of these references is incorporated herein.

1. J. Dubochet, et al., *Q. Rev. Biophys.* 21, 129 (1988).
2. R. A. Crowther, *The Resolution Revolution: Recent Advances in Cryo-EM*, vol. 579 of *Methods in Enzymology* (Elsevier, 2016).
3. R. M. Glaeser, *Current Opinion in Colloid and Interface Science* 34, 1 (2018).
4. C. Russo, L. A. Passmore, *Current Opinion in Structural Biology* 37, 81 (2016).
5. A. K. Geim, *Science* 324, 1530 (2009).
6. R. S. Pantelic, J. C. Meyer, U. Kaiser, W. Baumeister, J. M. Plitzko, *J. Struct. Biol.* 170, 152 (2010).
7. R. S. Pantelic, et al., *J. Struct. Biol.* 174, 234 (2011).
8. C. J. Russo, L. A. Passmore, *Nat. Methods* 11, 649 (2014).
9. A. Einstein, *Annalen der Physik* 322, 549 (1905).
10. C. Russo, L. A. Passmore, *Science* 346, 1377 (2014).
11. T. E. Daubert, R. P. Danner, *Physical and thermodynamic properties of pure chemicals: data compilation* (Taylor & Francis, Washington DC, 1989).
12. B. Wimberly, et al., *Nature* 407, 327 (2000).
13. T. Hussain, J. L. Llacer, B. T. Wimberly, J. S. Kieft, V. Ramakrishnan, *Cell* 167, 133 (2016).
14. K. Naydenova, C. J. Russo, *Nature Communications* 8, 1 (2017).
15. A. J. Noble, et al., *eLife* 7, e34257 (2018).
16. P. B. Rosenthal, R. Henderson, *J. Mol. Biol,* 333, 721 (2003).
17. J. Zivanov, et al., *eLife* 7, e42166 (2018).
18. C. F. Hryc, et al., *Proc Natl Acad Sci USA* 114, 3103 (2017).
19. J. Hattne, et al., *Structure* 26, 759 (2018).
20. X. Li, et al., *Nat. Methods* 10, 584 (2013).
21. G. Tang, et al., *Journal of Structural Biology* 157, 38 (2007).
22. K. Zhang, *Journal of Structural Biology* 193, 1 (2016).

23. E. F. Pettersen, et al., *J. Comput Chem.* 25, 1605 (2004).
24. D. N. Mastronarde, S. R. Held, *Journal of Structural Biology* 197, 102 (2017).
25. N. de Val, J.-P. Declercq, C. K. Lim, R. R. Crichton, *J. Inorg. Biochem.* 112, 77 (2012).
26. J. Zivanov, T. Nakane, S. H. W. Scheres, *IUCrJ* 6, 5 (2019).
27. National Institute of Standards and Technology, *NIST X-ray Photoelectron Spectroscopy Database*, vol. 20899 of *NIST Standard Reference Database* (Gaithersburg MD, 2000).
28. K. Naydenova, C. J. Russo, *Microscopy and Microanalysis* 24, 880 (2018).
29. C. A. Schneider, W. S. Rasband, K. W. Eliceiri, *Nat. Methods* 9, 671 (2012).
30. C. Russo, S. Scotcher, M. Kyte, *Review of Scientific Instruments* 87, 114302 (2016).
31. C. J. Russo, L. A. Passmore, *Journal of Structural Biology* 193, 33 (2016).

The invention claimed is:

1. An apparatus for functionalizing graphene or graphene oxide, the apparatus comprising:
   a plasma generator;
   a vacuum chamber connected to the plasma generator;
   a substrate holder, positioned to hold a substrate having a graphene or graphene oxide layer thereon within the vacuum chamber, and having a mounting area configured to have the substrate mounted therein;
   a shutter movable between an open position, in which the mounting area of the substrate holder is exposed to the vacuum chamber, and a closed position, in which the mounting area of the substrate holder is concealed;
   an injector, for injecting a functionalizing compound into the vacuum chamber; and
   a helium source, for supplying helium to the plasma generator.

2. An apparatus according to claim 1, wherein the apparatus further comprises a mask for masking an area of the substrate.

3. An apparatus according to claim 2, wherein the mask is moveable, and/or removable from the remainder of the apparatus.

4. An apparatus according to claim 2, wherein the apparatus is configured such that the mask is not in contact with the graphene or graphene oxide layer of the substrate when the substrate is held in the substrate holder, optionally wherein the mask is positioned less than 200 μm above the surface of the substrate.

5. An apparatus according to claim 1, further comprising a hydrogen source, for supplying hydrogen to the plasma generator.

6. An apparatus according to claim 1, further comprising a viewport opening into the vacuum chamber and a UV-vis spectrometer configured to analyse radiation emitted from the vacuum chamber through the viewport.

7. An apparatus according to claim 1, further comprising one or more functionalizing compound sources, each being connected to the injector, for supplying the functionalizing compound or compounds to the injector.

8. An apparatus according to claim 1, comprising a plurality of injectors, each injector being connected to a respective functionalizing compound source for supplying the functionalizing compound to the respective injector.

9. An apparatus according to claim 1, wherein the injector is a gas injector.

* * * * *